US 9,490,249 B2

(12) United States Patent
Lue et al.

(10) Patent No.: US 9,490,249 B2
(45) Date of Patent: Nov. 8, 2016

(54) ANTENNA EFFECT DISCHARGE CIRCUIT AND MANUFACTURING METHOD

(71) Applicant: MACRONIX INTERNATIONAL CO., LTD., Hsinchu (TW)

(72) Inventors: Hang-Ting Lue, Hsinchu (TW); Teng-Hao Yeh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 141 days.

(21) Appl. No.: 14/265,635

(22) Filed: Apr. 30, 2014

(65) Prior Publication Data

US 2015/0318273 A1    Nov. 5, 2015

(51) Int. Cl.
| H01L 27/06 | (2006.01) |
| H01L 27/02 | (2006.01) |
| H01L 23/552 | (2006.01) |
| H01L 21/8238 | (2006.01) |
| H01L 27/115 | (2006.01) |

(52) U.S. Cl.
CPC ... *H01L 27/0629* (2013.01); *H01L 21/823871* (2013.01); *H01L 23/552* (2013.01); *H01L 27/0266* (2013.01); *H01L 27/0292* (2013.01); *H01L 27/11573* (2013.01); *H01L 27/11582* (2013.01)

(58) Field of Classification Search
CPC .................. H01L 2224/752; H01L 2224/762; H01L 2224/772; H01L 2224/782; H01L 2224/792; H01L 2224/8011; H01L 2224/8111; H01L 2224/8211; H01L 2224/8311; H01L 2224/8411; H01L 2224/8511; H01L 2224/8611
See application file for complete search history.

(56) References Cited

U.S. PATENT DOCUMENTS

| 4,528,583 A | 7/1985 | te Velde et al. |
| 4,635,230 A | 1/1987 | Thomas et al. |
| 4,654,824 A | 3/1987 | Thomas et al. |
| 4,669,180 A | 6/1987 | Thomas et al. |
| 5,466,622 A | 11/1995 | Cappelletti |
| 5,548,146 A | 8/1996 | Kuroda et al. |
| 5,559,368 A | 9/1996 | Hu et al. |

(Continued)

OTHER PUBLICATIONS

Assaderaghi, et al., "Dynamic Threshold-Voltage MOSFET (DTMOS) for Ultra-Low Voltage VLSI," IEEE Trans. on Electron Devices, vol. 44, No. 3, Mar. 1997, 9 pages.

(Continued)

*Primary Examiner* — Mohammad Islam
*Assistant Examiner* — Mikka Liu
(74) *Attorney, Agent, or Firm* — Haynes Beffel & Wolfeld LLP

(57) ABSTRACT

An antenna effect discharge circuit is described for a device having patterned conductor layers, which may be exposed to charge inducing environments during a manufacturing process. The antenna effect discharge circuit has a terminal that is connected to a node on the device to be protected from charge accumulation and a gate, such as the gate of a field effect transistor in the circuit, and a terminal through which accumulated charge can be discharged to the substrate. A capacitor couples the gate in the antenna effect discharge circuit to the substrate. A voltage supply circuit is configured to provide voltage sufficient to bias the antenna effect discharge circuit in an off condition during operation of the device. A patterned conductor in the upper layer, and preferably the uppermost layer, of the device links the gate in the antenna effect discharge circuit to the voltage supply circuit.

19 Claims, 15 Drawing Sheets

(56) References Cited

U.S. PATENT DOCUMENTS

| | | |
|---|---|---|
| 5,760,445 A | 6/1998 | Diaz |
| 5,913,120 A | 6/1999 | Cappelletti |
| 5,946,177 A * | 8/1999 | Miller .................. H01L 27/0248 361/56 |
| 5,962,888 A | 10/1999 | Kim et al. |
| 5,994,742 A | 11/1999 | Krishnan et al. |
| 5,998,299 A | 12/1999 | Krishnan |
| 6,080,658 A | 6/2000 | Huang et al. |
| 6,113,648 A | 9/2000 | Schuelein et al. |
| 6,166,584 A | 12/2000 | De |
| 6,172,392 B1 | 1/2001 | Schmidt et al. |
| 6,218,895 B1 | 4/2001 | De et al. |
| 6,252,280 B1 | 6/2001 | Hirano |
| 6,261,878 B1 | 7/2001 | Doyle et al. |
| 6,271,713 B1 | 8/2001 | Krishnamurthy |
| 6,274,921 B1 | 8/2001 | Hasegawa |
| 6,277,723 B1 | 8/2001 | Shih et al. |
| 6,291,281 B1 | 9/2001 | Wang et al. |
| 6,300,819 B1 | 10/2001 | De et al. |
| 6,306,691 B1 | 10/2001 | Koh |
| 6,307,233 B1 | 10/2001 | Awaka et al. |
| 6,313,503 B1 | 11/2001 | Lee et al. |
| 6,320,423 B1 | 11/2001 | Sato |
| 6,323,076 B1 | 11/2001 | Wilford |
| 6,337,502 B1 | 1/2002 | Eitan et al. |
| 6,388,498 B1 | 5/2002 | Moriwaki et al. |
| 6,433,403 B1 | 8/2002 | Wilford |
| 6,437,408 B1 | 8/2002 | Shih et al. |
| 6,466,489 B1 | 10/2002 | Ieong et al. |
| 6,468,848 B1 | 10/2002 | Awaka et al. |
| 6,469,342 B1 | 10/2002 | Kuo et al. |
| 6,512,700 B1 | 1/2003 | McPartland et al. |
| 6,620,694 B1 | 9/2003 | Kuo et al. |
| 7,196,369 B2 | 3/2007 | Chou et al. |
| 7,317,633 B2 | 1/2008 | Lusky et al. |
| 7,709,898 B2 | 5/2010 | Takahashi |
| 7,791,514 B2 | 9/2010 | Yagi |
| 7,948,800 B2 | 5/2011 | Takahashi |
| 8,503,213 B2 | 8/2013 | Chen et al. |
| 2001/0026970 A1* | 10/2001 | Eitan .................. H01L 27/0266 438/215 |
| 2004/0007730 A1* | 1/2004 | Chou .................. H01L 27/092 257/314 |
| 2013/0062777 A1* | 3/2013 | Ogata .................. H01L 24/05 257/774 |

OTHER PUBLICATIONS

Chen et al., "A highly scalable 8-layer Vertical Gate 3D NAND with split-page bit line layout and efficient binary-sum MiLC (Minimal Incremental Layer Cost) staircase contacts," 2012 IEEE Int'l Electron Devices Meeting, Dec. 10-13, 2012, 4 pages.

Roizin, et al., "Plasma-induced charging in two bit per cell SONOS memories," 2003 8th IEEE Int'l Symposium on Plasma- and Process-Induced Damage, Apr. 24-25, 2003, pp. 61,64.

Shin et al., "Thin oxide damage by plasma etching and ashing processes," Proceedings, 1992 30th Annual IEEE Reliability Physics Symposium, Mar. 31-Apr. 2, 1992, pp. 37,41.

Verdonckt-Vandebroek, et al., "High-gain lateral bipolar action in a MOSFET structure," IEEE Transaction on Electron Devices, vol. 38, No. 11, Nov. 1991, pp. 2487,2496.

* cited by examiner

ANTENNA EFFECT DISCHARGE CIRCUIT AND MANUFACTURING METHOD

BACKGROUND

1. Field of the Invention

The present invention relates to integrated circuit structures which address charge accumulation during manufacture.

2. Description of Related Art

In the manufacturing of integrated circuits, some processes utilize activated ions. For example, backend processes including metal etching, photoresist stripping, and deposition of inter-metal dielectrics, involve plasmas which induce charge on the structures in the die being treated. This charging of structures during manufacturing can be referred to as the antenna effect.

Antenna effect induced charges may damage structures in the device, including structures critical to device performance. For example, in memory devices, word lines or other relatively large conductive structures can suffer significant charge accumulation due to the antenna effect. Charge accumulation on the word lines can expose tunnel dielectrics used in flash memory devices, gate dielectrics, and inter-polysilicon dielectrics, to damage by the accumulated charge. Furthermore, charge storage structures utilized in dielectric charge storage cells can be particularly susceptible to this kind of damage.

One characteristic of the plasma induced charge is that it may be either positive or negative, and different types of damage can occur based on the type of induced charge.

One approach to preventing or reducing the antenna effect is described in U.S. Pat. No. 7,196,369, entitled PLASMA DAMAGE PROTECTION CIRCUIT FOR A SEMICONDUCTOR DEVICE; by Chou et al. See also, U.S. Pat. No. 7,317,633 entitled PROTECTION OF NROM DEVICES FROM CHARGE DAMAGE; by Lusky et al.

It has been reported that the plasma charging effect plays a critical role in SONOS charge-trapping devices. In most Flash memory products, either PN diode protection, or poly fuse protection is adopted. However, both methods have limitations. For the PN diode protection, the word line WL operation voltage is restricted to only reverse direction of diode and must be lower than the breakdown voltage. Moreover, the PN diode only provides protection after breakdown voltage, thus it cannot protect the medium-range voltages. For poly fuse protection, it is necessary to rupture the fuse before measurement. The fuse protection is only suitable for small test device, but not suitable for a product design. Besides, if the rupture bias is too large it may disturb the device as well.

Electro static discharge (ESD) circuits have been deployed at the probing pads in integrated circuits to prevent inflated external electric pulses that damage the devices. However, ESD circuits are often activated under relative highs voltage and cannot provide a medium-voltage protection.

Accordingly, it is desirable to provide a protection circuit for use in the manufacturing of integrated circuits that protects against charge damage. Furthermore, the protection circuit should not affect device operation after manufacturing.

SUMMARY

An antenna effect discharge circuit is described for a device having a plurality of layers of patterned conductors, such as patterned polysilicon layers and metal layers, which may be exposed to high-energy plasma or other charge inducing environments during the manufacturing process. The antenna effect discharge circuit has a terminal that is connected to a node on the device to be protected from charge accumulation and a gate, such as the gate of a field effect transistor in the circuit. A capacitor couples a gate in the antenna effect discharge circuit to the substrate. A voltage supply circuit is configured to provide voltage sufficient to bias the antenna effect discharge circuit in an off condition during operation of the device. A patterned conductor in the upper layer, and preferably the uppermost layer, of the device links the gate in the antenna effect discharge circuit to the voltage supply circuit.

The antenna effect discharge circuit can include a field effect transistor having a channel, a source and a drain in a channel well region. The channel well region can be connected via the patterned conductor in the upper layer to the gate, or directly to the voltage supply circuit. In embodiments configured to discharge both negative and positive voltages on the node to be protected, the antenna effect discharge circuit includes an n-channel field effect transistor (e.g. NMOS) and a p-channel field effect transistor (e.g. PMOS) configured as described in more detail below.

Utilizing a capacitor at the gate can prevent the voltage on the gate from tracking the voltage in the channel well region during exposure to antenna effect charging. The antenna effect discharge circuit remains in a condition in which the gate and the channel well are not connected until the upper layer of the plurality of patterned conductor layers is implemented.

Embodiments are described in which the antenna effect discharge circuit includes a switch configured to close during operation of the device, and having first and second terminals. The first terminal is connected to the gate in the antenna effect discharge circuit by a first connector, and the second terminal is connected to the voltage supply circuit by a second connector. One or both of the first and second connectors includes the patterned conductor in the uppermost layer used to connect the gate to the voltage supply circuit. In embodiments with the switch, the antenna effect discharge circuit remains effective throughout manufacturing, until the voltage supply circuit is enabled during operation of the device.

A method for manufacturing an integrated circuit device is described which includes forming integrated circuitry on a substrate having a node to be protected from antenna effect charging. The method includes forming an antenna effect discharge circuit on the substrate having a terminal connected to the node and a gate. Also, the method includes forming a capacitor to couple the gate to the substrate. A voltage supply circuit is provided on the substrate to bias the gate during operation to turn off the antenna effect discharge circuit. As described herein the method includes connecting the gate to a voltage supply circuit using an upper, or uppermost, patterned conductor layer on the device. In some embodiments, the method includes providing a switch on the device between the gate and the voltage supply circuit, and configuring the switch to close during operation so that the gate is connected to the voltage supply circuit via the switch.

Other aspects and advantages of the present technology can be seen on review of the drawings, the detailed description and the claims, which follow.

DETAILED DESCRIPTION

A detailed description of embodiments of the present invention is provided with reference to the FIGS. 1-20.

Figure 1:
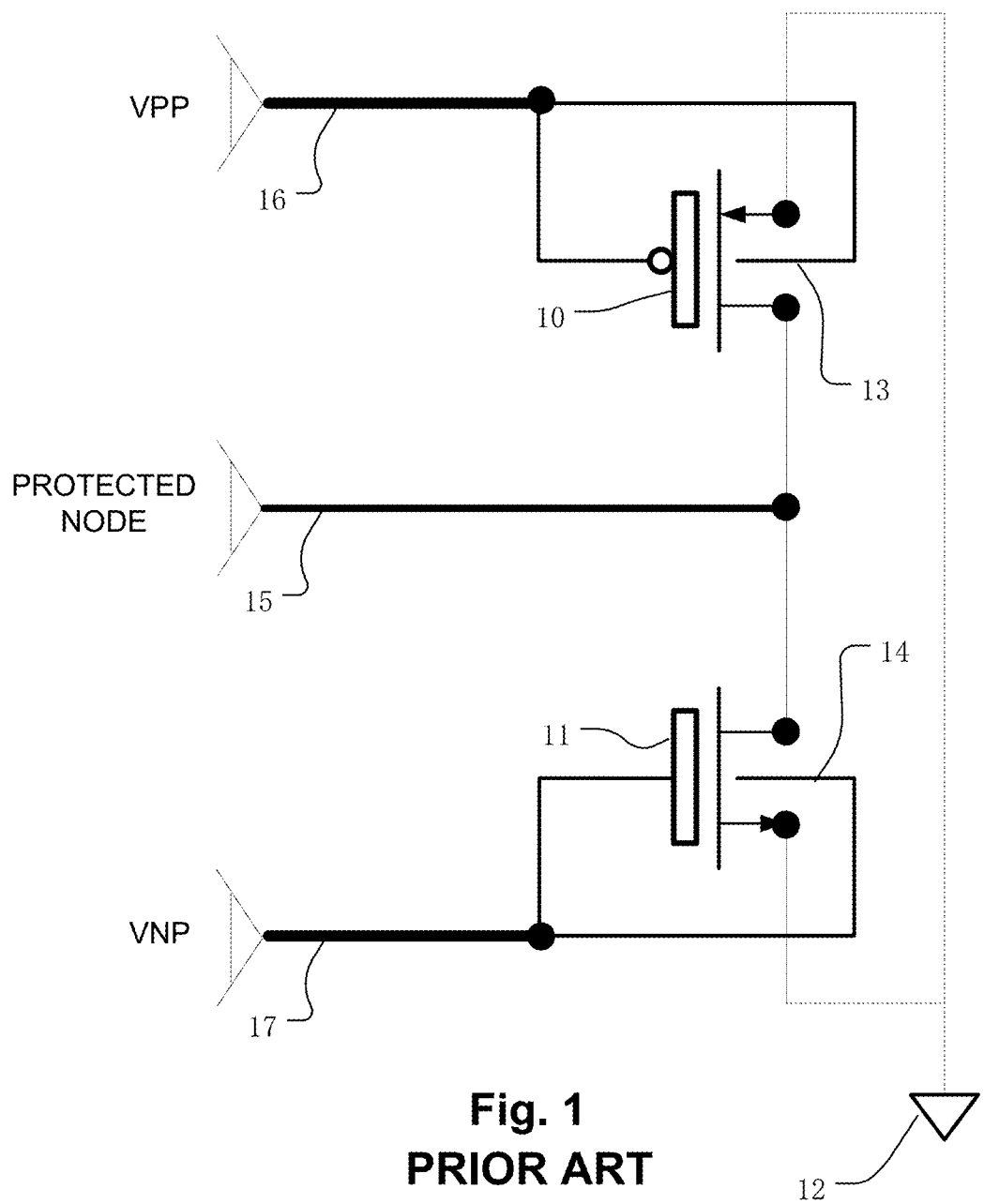
FIG. 1 is a schematic diagram of prior art antenna effect discharge circuit based on dynamic threshold voltage MOSFETs.

FIG. 1 illustrates a prior art protection circuit for the antenna effect, based on a dynamic threshold MOS pair of transistors 10, 11. The drain of the PMOS transistor is coupled to the substrate ground 12. Likewise, the drain of the NMOS transistor 11 is coupled to the substrate ground 12. The channel well 13 in the channel region of the PMOS transistor is connected to the gate of the PMOS transistor using a lower patterned conductor, like the first metal layer. Likewise, the channel well 14 in the channel region of the NMOS transistor 11 is connected to the gate of the NMOS transistor 11 using a lower patterned conductor, like the first metal layer. The sources of the PMOS transistor 10 and the NMOS transistor 11 are connected to the node 15 that is to be protected from the charge buildup caused by the antenna effect.

The terms "source" and "drain" are often used by convention to designate terminals of field effect transistors with reference to the dominant current flow direction in the transistor. This designation convention is ambiguous in some situations, such as when describing devices supporting current flow in both directions, and when describing devices in which the terminals having symmetric structures. The terms "source" and "drain" herein are used merely to give distinct labels to the two terminals of field effect transistors, without implying a dominant current flow direction or structure of the terminals. As such, the terms "source" and "drain" are interchangeable herein.

The gate oxides for the MOS pair 10, 11 are thick enough to sustain high-voltage operation for flash memory devices or other high-voltage integrated circuits. The thick gate oxide can be easily manufactured in flash memory devices, by using the same processing step as is used to produce for example the thick oxides for charge pump transistors.

During manufacture, positive charge is conducted to ground 12 via the PMOS transistor 10, and negative charge is conducted to ground via the NMOS transistor 11 at very low voltages. For example, the NMOS transistor 11 will conduct at a voltage close to the junction forward turn on voltage of, for example, 0.6 V. Likewise, the PMOS transistor will conduct at a voltage close to the junction forward turn on voltage of, for example, −0.6 V. For a discussion of the operation of dynamic threshold MOS devices, see, IEEE ELECTRON DEVICES, Vol. 38, No. 11, November, 1991. See, also, U.S. Pat. No. 7,196,369, entitled PLASMA DAMAGE PROTECTION CIRCUIT FOR A SEMICONDUCTOR DEVICE, issued 27 Mar. 2007.

During operation of the integrated circuit, the gate of the PMOS device 10 is connected to a high positive voltage VPP by line 16, which is high enough to turn off the device 10 when the highest operating potential is applied to the node being protected. Likewise, the gate of the NMOS device 11 is connected by line 17 to a high magnitude negative voltage VNP, which has sufficient magnitude to turn off the device 11, when the most negative operating potential is applied to the node being protected.

During manufacturing, if the voltage on the node being protected gets high quickly, gate and substrate terminals on the transistors charge very quickly in the dynamic threshold structure shown in FIG. 1. As a result, a very low gate-to-substrate potential may occur making it difficult to turn on the device. Thus, protection circuits like that of FIG. 1 may not fully turn on quickly in some conditions. The protection provided therefore may not be very effective to quickly discharge accumulated charge in protected nodes such as word lines that can be exposed to significant charging effects during manufacturing.

Figure 2:
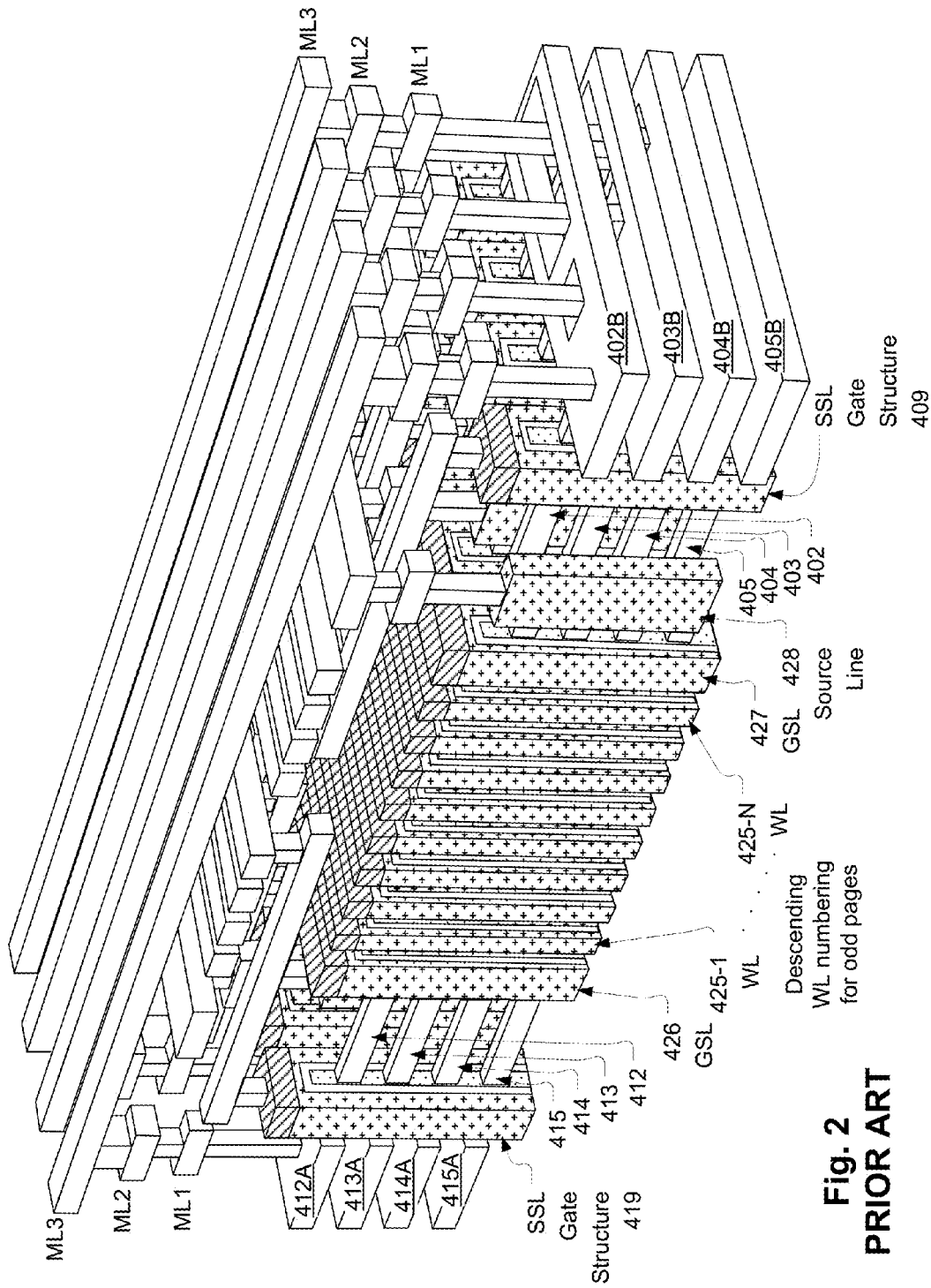
FIG. 2 is a perspective view of one example prior art integrated circuit including multiple patterned conductor layers which can be protected using antenna effect discharge circuits as described herein.

FIG. 2 is a perspective illustration of a 3D NAND-flash memory array structure, set out here as an example of a device having multiple patterned conductor layers, including patterned polysilicon layers and patterned metal layers, and with which antenna effect discharge circuits described herein can be used. See, U.S. Pat. No. 8,503,213. Of course, many other types of devices utilize multiple patterned conductor layers and can be protected using antenna effect discharge circuits as described herein. In FIG. 2, insulating material is removed from the drawing to expose additional structure. For example, insulating layers are removed between the semiconductor strips, in the ridge-shaped stacks, and are removed between the ridge-shaped stacks of semiconductor strips.

The multilayer array is formed on an insulating layer, and includes patterned polysilicon layers providing a plurality of word lines 425-1, . . . , 425-$n$–1, 425-$n$ conformal with a plurality of ridge-shaped stacks. The plurality of ridge-shaped stacks includes semiconductor strips 412, 413, 414, 415. Semiconductor strips in the same plane are electrically coupled together by stairstep structures.

Stairstep structures 412A, 413A, 414A, 415A terminate semiconductor strips, such as semiconductor strips 412, 413, 414, 415. As illustrated, these stairstep structures 412A, 413A, 414A, 415A are electrically connected to different bit lines for connection to decoding circuitry to select planes within the array. These stairstep structures 412A, 413A, 414A, 415A can be patterned at the same time that the plurality of ridge-shaped stacks are defined.

Stairstep structures 402B, 403B, 404B, 405B terminate semiconductor strips, such as semiconductor strips 402, 403, 404, 405. As illustrated, these stairstep structures 402B, 403B, 404B, 405B are electrically connected to different bit lines for connection to decoding circuitry to select planes within the array. These stairstep structures 402B, 403B, 404B, 405B can be patterned at the same time that the plurality of ridge-shaped stacks are defined.

Any given stack of semiconductor strips is coupled to either the stairstep structures 412A, 413A, 414A, 415A, or the stairstep structures 402B, 403B, 404B, 405B, but not both, in this configuration. A stack of semiconductor strips has one of the two opposite orientations of bit line end-to-source line end orientation, or source line end-to-bit line end orientation. For example, the stack of semiconductor strips 412, 413, 414, 415 has bit line end-to-source line end orientation; and the stack of semiconductor strips 402, 403, 404, 405 has source line end-to-bit line end orientation.

The stack of semiconductor strips 412, 413, 414, 415 terminated at one end by the stairstep structures 412A, 413A, 414A, 415A, passes through SSL gate structure 419, gate select line GSL 426, word lines 425-1 WL through 425-N WL, gate select line GSL 427, and is terminated at the other end by a corresponding source line. The stack of semiconductor strips 412, 413, 414, 415 does not reach the stairstep structures 402B, 403B, 404B, 405B.

The stack of semiconductor strips 402, 403, 404, 405 terminated at one end by the stairstep structures 402B, 403B, 404B, 405B, passes through SSL gate structure 409, gate select line GSL 427, word lines 425-N WL through 425-1 WL, gate select line GSL 426, and is terminated at the other end by a source line (obscured by other parts of figure). The stack of semiconductor strips 402, 403, 404, 405 does not reach the stairstep structures 412A, 413A, 414A, 415A.

A layer of memory material separates the word lines 425-1 through 425-$n$, from the semiconductor strips 412-415 and 402-405 as described in detail in prior figures. Ground select lines GSL 426 and GSL 427 are conformal with the plurality of ridge-shaped stacks, similar to the word lines.

Bit lines and string select lines are formed at the metals layers ML1, ML2, and ML3.

Transistors are formed between the stairstep structures 412A, 413A, 414A and the word line 425-1. In the transistors, the semiconductor strip (e.g. 413) acts as the channel region of the device. SSL gate structures (e.g. 419, 409) are patterned during the same step that the word lines 425-1 through 425-$n$ are defined. A layer of silicide can be formed along the top surface of the word lines, the ground select lines, and over the gate structures 409, 419. The layer of memory material can act as the gate dielectric for the transistors. These transistors act as string select gates coupled to decoding circuitry for selecting particular ridge-shaped stacks in the array.

The first metal layer ML1 includes string select lines with a lengthwise orientation parallel to the semiconductor material strips. These ML1 string select lines are connected by interlayer connectors to different SSL gate structures (e.g., 409, 419).

The second metal layer ML2 includes string select lines with a widthwise orientation parallel to the word lines. These ML2 string select lines are connected by interlayer connectors to different ML1 string select lines.

In combination, these ML1 string select lines and ML2 string select lines allow a string select line signal to select a particular stack of semiconductor strips.

The first metal layer ML1 also includes two source lines with a widthwise orientation parallel to the word lines.

The third metal layer ML3 includes bit lines with a lengthwise orientation parallel to the semiconductor material strips. Different bit lines are electrically connected by interlayer connectors to different steps of the stairstep structures 412A, 413A, 414A, 415A and 402B, 403B, 404B, 405B. These ML3 bit lines allow a bit line signal to select a particular horizontal plane of semiconductor strips.

A fourth metal layer (not shown—which may be called ML4) can be included for connecting peripheral circuits to the memory array, such as drivers, sense amplifiers, decoders, voltage supply generators and the like.

Interlayer connectors (illustrated but not labeled) in vias between the patterned layers, are provided to make connections among nodes and conductors in the multiple patterned conductor layers and other components on the device.

Figure 3:
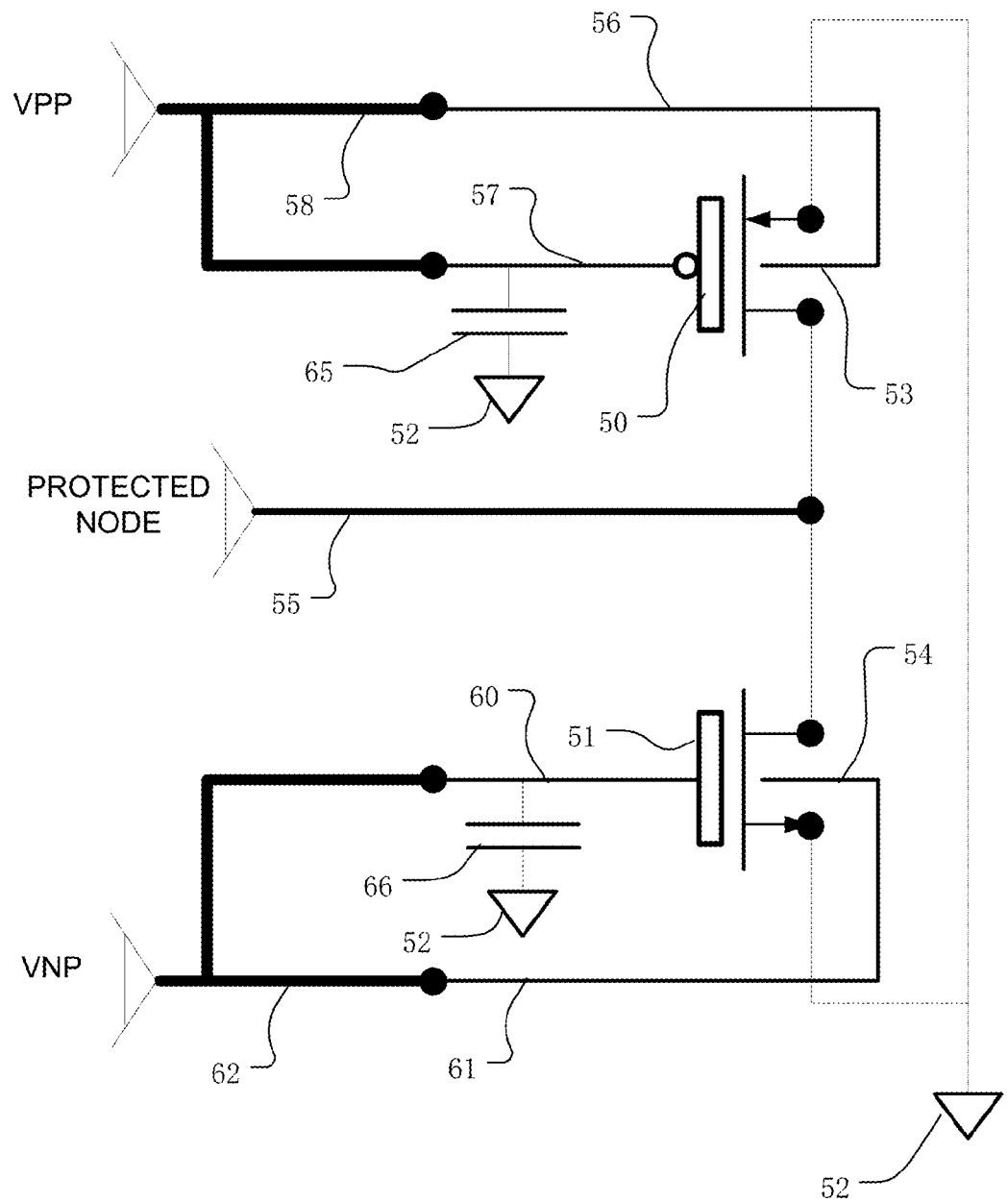
FIG. 3 is a schematic diagram of an antenna effect discharge circuit including a capacitor coupled to a gate of the field effect transistor.

FIG. 3 is a circuit diagram for an antenna protection discharge circuit including field effect transistors having their gates coupled to the semiconductor substrate via a capacitor. The antenna effect discharge circuit has a terminal (e.g. a drain of field effect transistor 50) that is connected to a node 55 on the device to be protected from charge accumulation and a gate, such as the gate of a field effect transistor 50 in the circuit, and a terminal (e.g. a source of field effect transistor 50) through which accumulated charge can be discharged to the substrate.

In the circuit, a p-channel field effect transistor 50 and an n-channel field effect transistor 51 have drains coupled to a node 55 to be protected from antenna effect charging. The sources of the field effect transistors 50, 51 are connected to the substrate 52. The gate of the field effect transistor 50 is connected by a patterned conductor 57 (e.g. a polysilicon line) to a capacitor 65 having a first terminal connected to the conductor 57 and a second terminal in or connected to the substrate 52. The gate of the field effect transistor 51 is connected by a patterned conductor 60 (e.g. a polysilicon line) to a capacitor 66 having a first terminal connected to the conductor 60 and a second terminal in or connected to the substrate 52.

The p-channel field effect transistor 50 has a channel in an n-type semiconductor region, referred to herein as a channel well 53, in the substrate. The channel well 53 is connected to a conductor 56. The conductor 56 and conductor 57 are not connected during manufacturing of the device, until an upper patterned conductor layer, preferably the uppermost patterned conductor layer, is formed. The upper patterned conductor layer includes a conductor 58 which provides connection between the channel well 53 and the gate of the field effect transistor 50 via the conductors 57 and 56. Also, the conductor 58 connects to the voltage supply circuit, which provides the bias voltage VPP.

The n-channel field effect transistor 51 has a channel in a p-type semiconductor region, referred to herein as a channel well 54, in the substrate. The channel well 54 is connected to a conductor 61. The conductor 61 and conductor 60 are not connected during manufacturing of the device, until an upper patterned conductor layer, preferably the uppermost patterned conductor layer, is formed. The upper patterned conductor layer includes a conductor 62 which provides connection between the channel well 54 and the gate of the field effect transistor 51 via the conductors 60, 61. Also the conductor 62 connects to the voltage supply circuit, which provides the bias voltage VNP.

Figure 4:
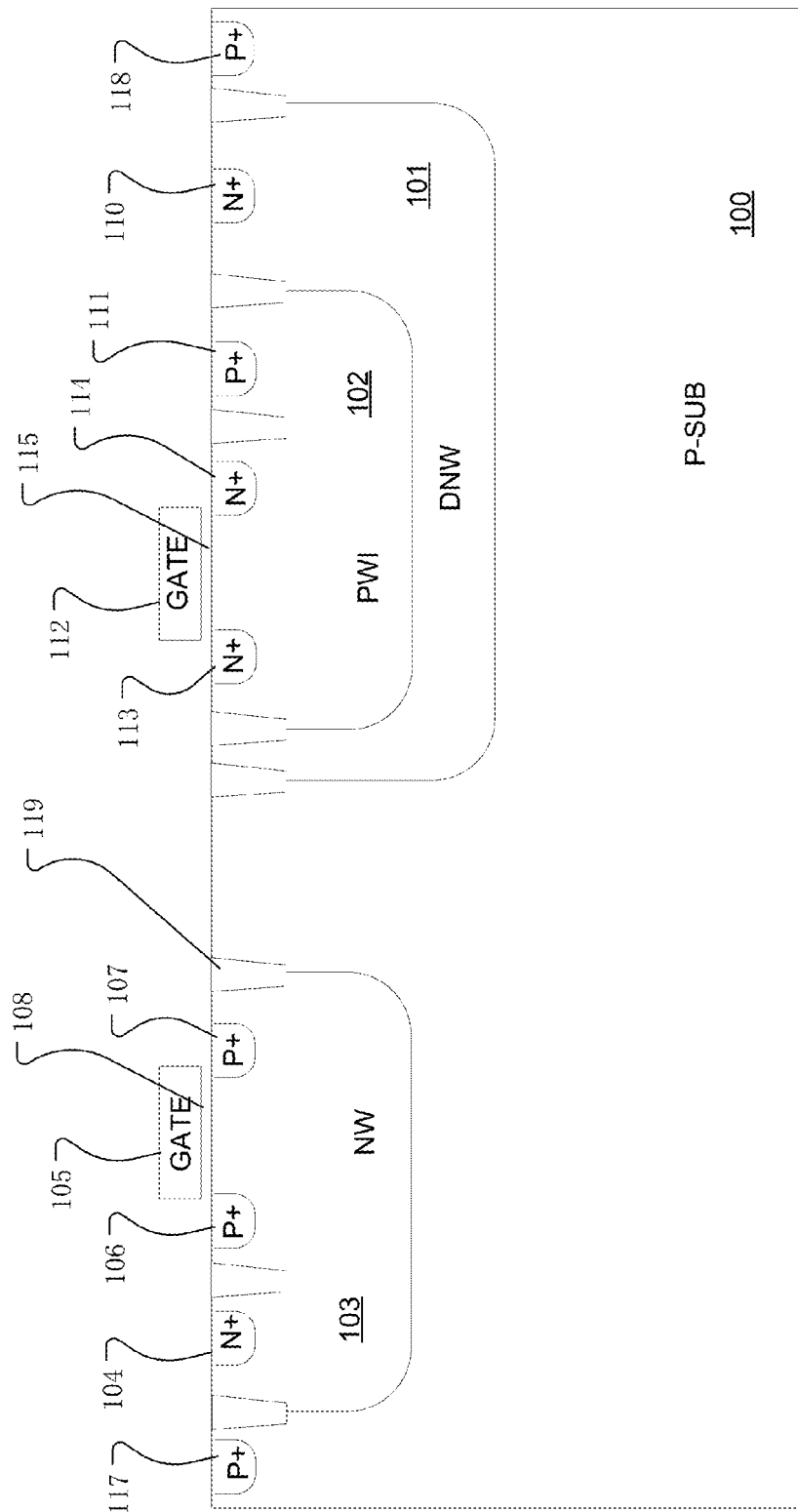
FIG. 4 illustrates a configuration of the device substrate for an antenna effect discharge circuit including high-voltage, n-channel and p-channel field effect transistors as described herein.

FIG. 4 illustrates the substrate and well structure which can be used for the high voltage, p-channel and high voltage n-channel field effect transistors (HV-PMOS and HV-NMOS) for the circuit of FIG. 3. This example, the device is formed on a p-type substrate 100. The p-channel field effect transistor is formed in an n-type semiconductor well 103, which corresponds to the channel well 53 of FIG. 3. The re-channel field effect transistor is formed in a p-type semiconductor well 102, which in turn is isolated from the substrate 100 by a deep n-type well 101. The p-type semiconductor well 102 corresponds with the channel well 54 of FIG. 3.

FIG. 4 illustrates source and drain regions 106, 107, the gate 105 and the gate insulator 108 of the p-type field effect transistor (HV-PMOS). Also, an n-type contact region 104 is formed in the n-type well 103 to provide for connection to the bulk of the channel well. Also, the source and drain regions 113, 114, the gate 112, and the gate insulator 115 of the n-type field effect transistor (HV-NMOS) are illustrated. Also, a p-type contact region 111 is formed in the p-type well 102 to provide for connection to the bulk of the channel well. In addition, an n-type contact region 110 is formed in the deep n-type well 101 to provide for connection of the deep n-well to biasing circuitry to aid in isolation of the channel well 102. To provide substrate connection for the capacitors, not shown, p-type contact regions 117 and 118 can be disposed in the substrate outside the wells 101 and 103. Shallow trench isolation STI structures (e.g. 119) can be disposed between doped regions as illustrated for improved isolation.

As mentioned with respect to FIG. 1, in a prior art DTMOS type antenna effect discharge circuit, the gate and channel well contact (e.g. 105, 104) are connected during manufacture. This connection causes the voltage between the gate and the channel well to remain close to zero, during charging events that apply a positive voltage to the drain 107. The circuit described herein with respect to FIG. 3, the gate and channel well contact (e.g. 105, 104), are not connected during formation of all or most of the patterned conductor layers. Rather, the gate (e.g. 105) is connected to a capacitor, while the channel well (e.g. 104, 103) floats. Thus, even while the channel well is boosted by a voltage increase on the node to be protected, the gate potential will change only by a factor of the gate coupling ratio, because the capacitor and gate to well capacitance of the transistor divide the voltage difference. This allows the field effect transistor to turn on more quickly during an antenna effect charging episode, discharging the undesirable voltages more effectively.

The capacitors 65, 66 can be implemented using a capacitor connected, high voltage NMOS transistor in the p-type substrate, with the source and drain connected together, having a gate formed by a patterned conductor, such as the same patterned conductor that forms the gate of the corresponding field effect transistor (HV-PMOS or HV-NMOS). Alternatively, the capacitors can be implemented by a single continuous well separated from a conductor by a dielectric layer such as a layer of the dielectric used to form the gate dielectric for the HV-NMOS and HV-PMOS devices of FIG. 3, in which implementation there is no channel area beneath the conductor. To establish a high coupling ratio, the area of the conductor on the capacitor can be about larger than the area of the gate on the corresponding field effect transistor 50, 51. In one example, the area of the gate on the capacitor can be about four times greater than the area of the gate, so that a gate coupling ratio of about 0.8 is established.

Figure 5:
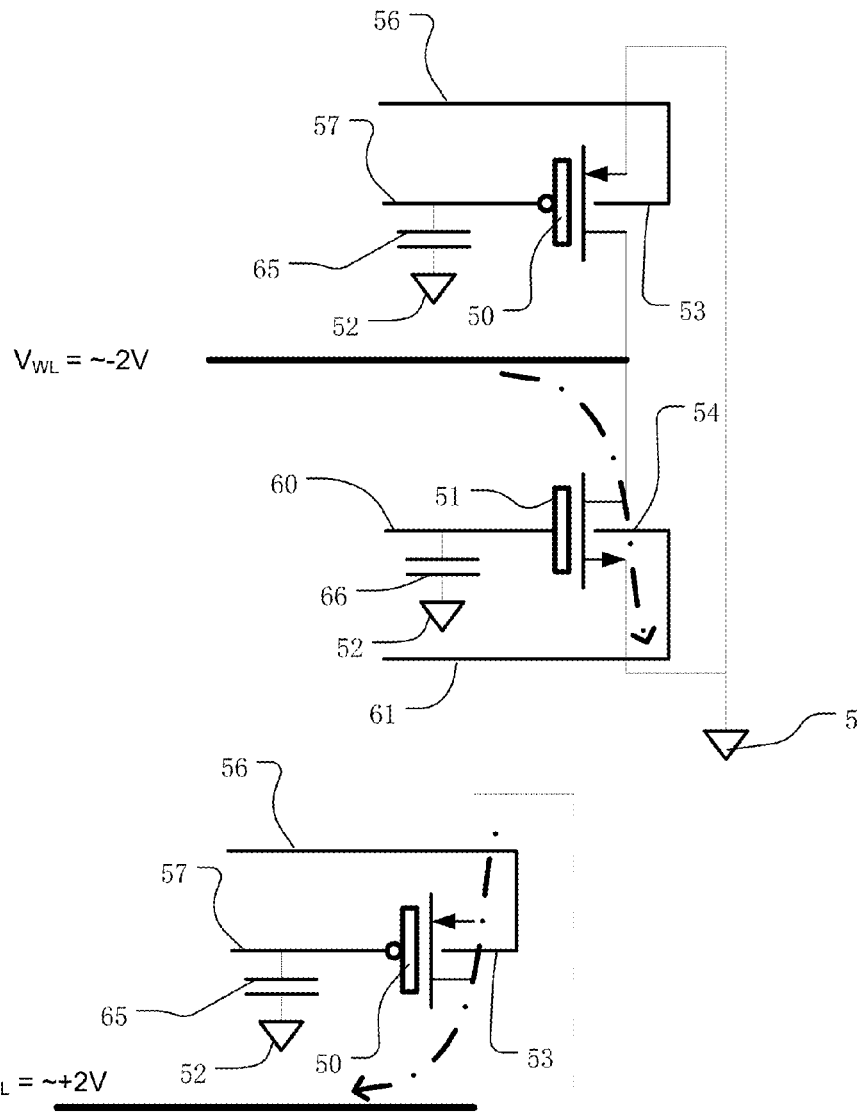
FIG. 5 is a schematic diagram of an antenna effect discharge circuit prior to the formation of the uppermost patterned conductor layer, and illustrating discharge of a negative voltage buildup on the node to be protected.
Figure 6:
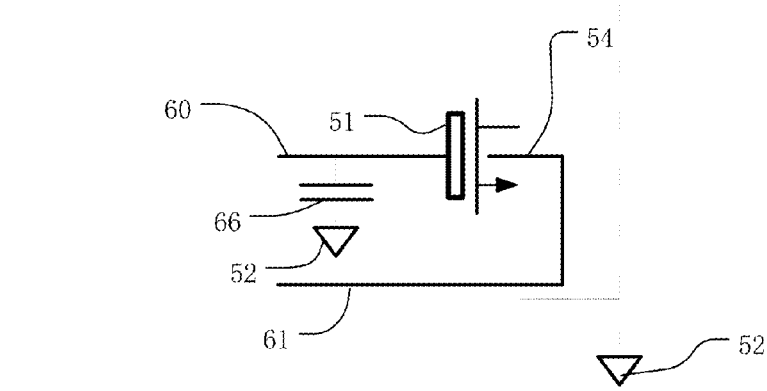
FIG. 6 is a schematic diagram of an antenna effect discharge circuit prior to formation of the uppermost patterned conductor layer, and illustrating discharge of a positive voltage buildup on the node to be protected.

FIGS. 5 and 6 illustrate the antenna effect discharge circuit of FIG. 3 such as occurs during formation of the lower patterned conductor layers on the device prior to formation of the connection between the gate and channel well. Reference numerals used in FIG. 3 for the corresponding elements are the same, and not described again.

In the condition shown in FIG. 5, a node to be protected such as a word line may be charged a value of about −2 V during a manufacturing step. In this condition, the p+ drain to n-type channel well junction is reversed biased in the p-channel field effect transistor 50. So the p-channel field effect transistor 50 remains off. However, the n+ drain to p-type channel well junction is forward biased in the n-channel field effect transistor 51. The capacitor 66 prevents the gate of the n-channel field effect transistor 51 from charging up to the same voltage as the p-type channel well 54. Thus, when the node being protected reaches about negative 2 volts, the floating p-type channel well of the n-channel field effect transistor is quickly charged to about the same voltage as the node being protected through the forward junction. If there is sufficient capacitance in the capacitor 66, providing a relatively large gate coupling ratio, the gate voltage will shift by the capacitive dividing ($V_{WL}*(1-GCR)$) to value greater than negative 1 V (e.g. >−1V), closer to the zero voltage of the p-type substrate 52. This maintains a positive gate to channel well bias Vgb of magnitude less than about 1 V in this illustration, sufficient to turn on the n-channel field effect transistor quickly discharging the unwanted charge on the node being protected, during the manufacturing step.

In the condition shown in FIG. 6, a node to be protected such as a word line may be charged to a value of about +2 V during a manufacturing step. In this condition the n+ drain to p-type channel well junction is reversed biased in the n-channel field effect transistor 51. So the n-channel field effect transistor 51 remains off. However, the p+ drain to n-type channel well junction is forward biased in the p-channel field effect transistor 50. The capacitor 65 prevents the gate of the p-channel field effect transistor 50 from shifting to the same voltage as the n-type channel well 53. Thus, when the node being protected reaches about positive 2 volts, the floating n-type channel well of the p-channel field effect transistors quickly charges to about the same voltage by the forward junction. If there is sufficient capacitance in the capacitor 65, providing a relatively large gate coupling ratio, the gate shifts to a value of less than about 1 V (e.g. <+1V), closer to the zero voltage of the p-type substrate 52.

This maintains a negative gate to channel well bias Vgb with a magnitude less than about 1 V in this illustration, sufficient to turn on the p-channel field effect transistor 50 quickly, discharging the unwanted charge on the node being protected during the manufacturing step.

In the circuit of FIG. 3, after the upper patterned conductor layer is fabricated, which can be the uppermost patterned conductor layer, the gate and channel well are connected. In processes in which some in charging may occur, such as during passivation for example or other layers overlying the upper patterned conductor, after the connection of the gate and the channel well, protection provided by the antenna effect discharge circuit may be less effective.

Figure 7:
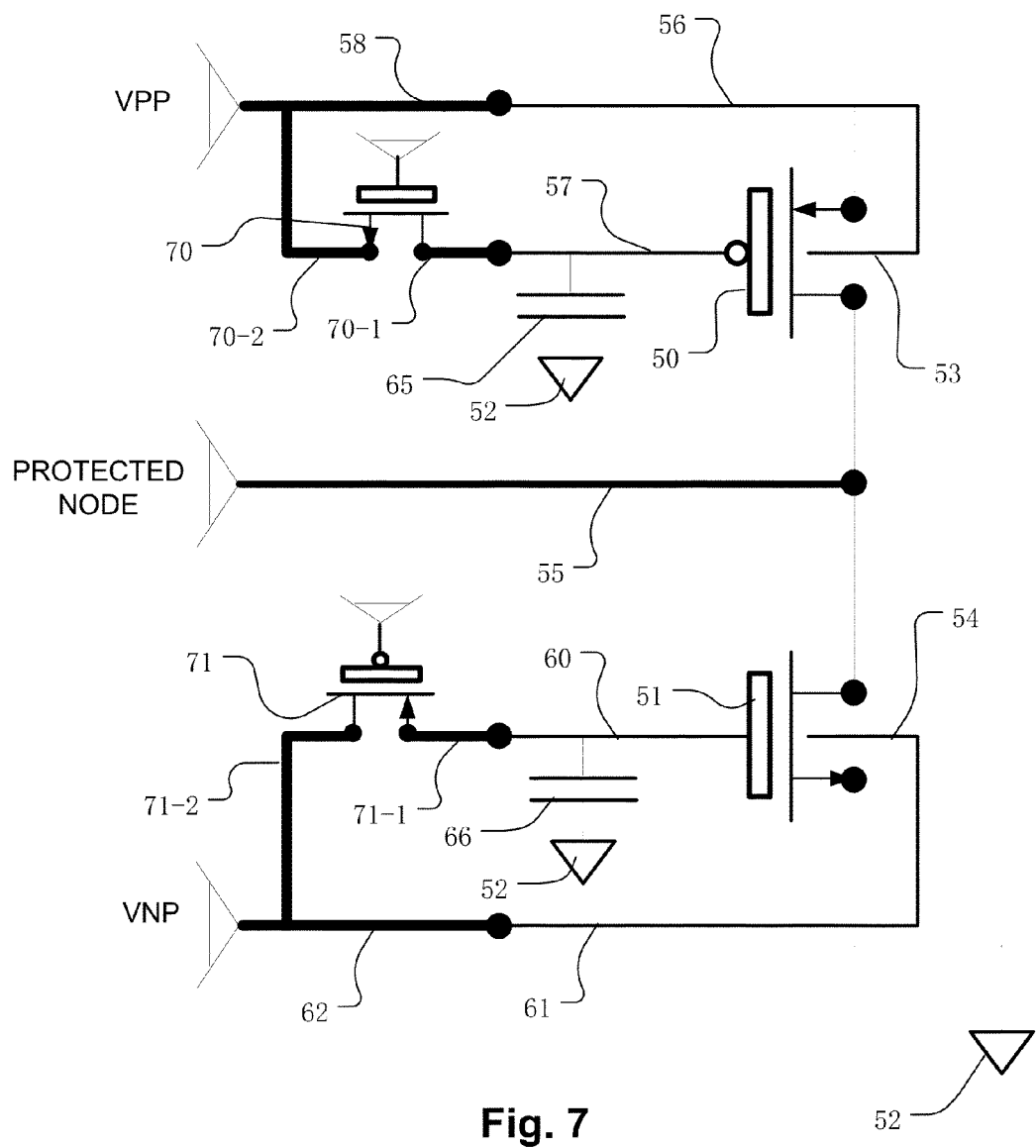
FIG. 7 is a schematic diagram of an alternative implementation of an antenna effect discharge circuit including a capacitor coupled to a gate of the field effect transistor, and a switch between the gate and the voltage supply circuit.

FIG. 7 illustrates an alternative implementation of an antenna effect discharge circuit which can maintain protection after formation of the patterned conductor layer used to connect the gate and the channel well. The circuit components are given the same reference numerals as those used in FIG. 3, where appropriate. In this example, switches are added between the capacitors and the voltage supply circuit, which allows a process that keeps the gates of the field effect transistors 50, 51 isolated from the channel wells 53, 54 until the device receives operating voltages that can close the switches. In this manner, protection against the antenna effect can be maintained throughout the manufacturing process.

The switch in this example for the p-channel field effect transistor 50 is a high voltage n-channel field effect transistor 70 (e.g. HV-NMOS like that shown in FIG. 4) having a first terminal (source or drain) connected by a first connector 70-1 to the gate via conductor 57 and a second terminal (source or drain) connected by a second connector 70-2 to the supply voltage circuit. One or both of the connectors 70-1, 70-2 can be formed in an upper, preferably the uppermost, patterned conductor layer on the device. The gate of the n-channel field effect transistor 70 is connected to the voltage supply circuit to receive a bias during operation, such as VPP, to close the switch.

The switch in this example for the n-channel field effect transistor 51 is a high voltage p-channel field effect transistor 71 (e.g. HV-PMOS like that shown in FIG. 4), having a first terminal (source or drain) connected by a first connector 71-1 to the gate via conductor 60 and a second terminal (source or drain) connected by a second connector 71-2 to the supply voltage circuit. One or both of the connectors 71-1, 71-2 can be formed in an upper, preferably the uppermost, patterned conductor layer on the device. The gate of the p-channel field effect transistor 71 is connected to the voltage supply circuit to receive a bias during operation, such as VNP, to close the switch.

In this manner, the antenna effect discharge circuit remains effective until the switch transistors 70, 71 are turned on closing switch.

Figure 8:
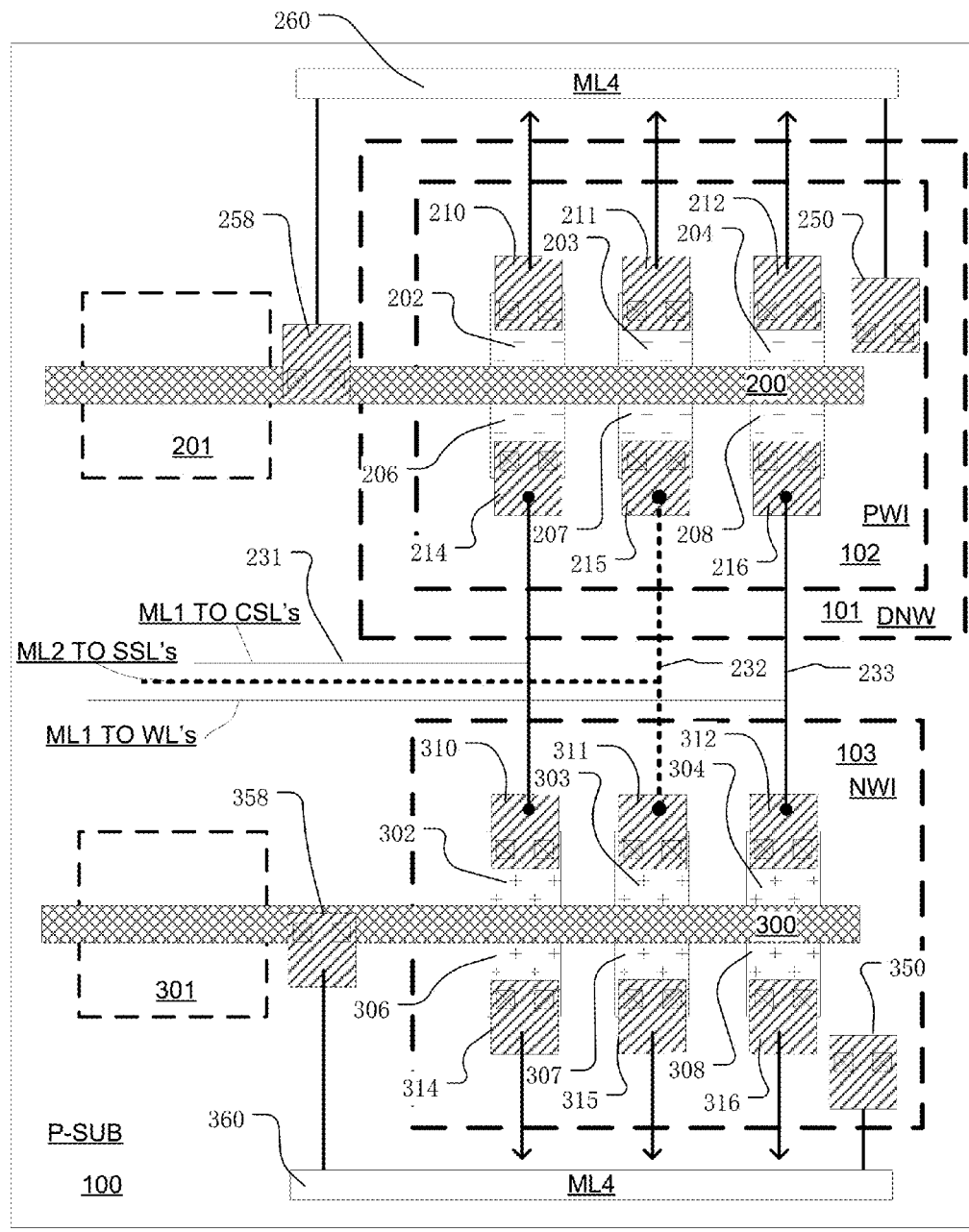
FIG. 8 is a layout view of one example antenna effect discharge circuit, configured to protect multiple nodes on an integrated circuit.

FIG. 8 is a layout view of an antenna protection circuit including capacitors coupled to the gates of the high-voltage field effect transistors. The layout in this example is formed on a p-type substrate 100. An n-type channel well 103 is formed in the substrate 100. Also, a deep n-type well 101 is formed, with a p-type channel well 102 therein. Substrate contacts (e.g. 104, 110, 111 shown in FIG. 4) can be arrayed around the wells to provide appropriate bias during operation. Also, guard rings (not shown) can be formed around the wells, using polysilicon layer conductors for example. The deep n-type well, the p-type substrate and the guard rings can be connected together via the contacts, and grounded during operation.

A set of high-voltage, n-channel field effect transistors are formed in the p-type channel well 102. In this example, there are three transistors in the well 102. A first transistor includes a drain terminal 202 and a source terminal 206. A second transistor includes a drain terminal 203, and a source terminal 207. A third transistor includes a drain terminal 204 and a source terminal 208. The drain terminals 202, 203, 204 are connected to patterned conductors 210, 211, 212 in one of the lower patterned conductor layers, such as a first metal layer, by the interlayer connectors represented by the small squares in the figure. The source terminals 206, 207, 208 are connected to patterned conductors 214, 215, 216 which connect to corresponding nodes to be protected by the circuit. For example, the patterned conductor 214 can be a first metal layer conductor connected to common source lines 231 in a memory structure such as that of FIG. 2. The patterned conductor 215 can be a second metal layer conductor connected to string select lines 232 in a memory structure such as that of FIG. 2. The patterned conductor 216 can be a first metal layer conductor connected to one or more word lines 233 in a memory structure such as that FIG. 2.

The gates for the three transistors are formed by a single patterned polysilicon line 200 which extends outside of the region including the channel well 102 over a first, n-type capacitor terminal diffusion 201 acting as a second terminal of the capacitor. The area of the polysilicon line 200 over the capacitor terminal diffusion 201 provides the first terminal of the capacitor, and should be greater than the areas of the gates of the transistors in the p-type well 102 as discussed above to establish a high gate coupling ratio.

The patterned conductors 210, 211, 212, are connected to the p-type substrate 100 as represented by the arrows in the drawing.

A patterned conductor 258 is connected by interlayer connectors to the gate polysilicon line 200. Likewise, a patterned conductor 250 is connected by interlayer connectors to the channel well 102. The patterned conductors 258 and 250 can be formed in lower ones of the patterned conductor layers on the device, such as in a first metal layer. The conductors 258 and 250 are connected to a conductor 260 in the upper patterned conductor layer labeled ML4 in this example, for a four metal process.

Also, high-voltage, p-channel field effect transistors are formed in the n-type channel well 103. In this example, there are three transistors in the well 103. A first transistor includes a drain terminal 306 and a source terminal 302. A second transistor includes a drain terminal 307 and a source terminal 303. A third transistor includes a drain terminal 308 and a source terminal 304. The drain terminals 306, 307, 308 are connected to a patterned conductors 314, 315, 316 in one of the lower patterned conductor layers, such as a first metal layer, by interlayer connectors. The source terminals 302, 303, 304 are connected to pattern conductors 310, 311, 312 which connect to corresponding nodes to be protected by the circuit. For example, the patterned conductor 310 can be connected to common source lines 231, the patterned conductor 311 can be connected to string select lines 232. The patterned conductor 312 can be connected to one or more word lines 233.

The gates for the three transistors are formed by a single patterned polysilicon line 300 which extends outside of the region including the channel well 103 over a second, n-type capacitor terminal diffusion 301 acting as a second terminal of the capacitor. The area of the polysilicon line 300 over the capacitor terminal diffusion 301 provides the first terminal of the capacitor, and should be greater than the areas of the gates of the transistors in the n-type well 103 as discussed above to establish a high gate coupling ratio.

The pattern conductors 314, 315, 316, are connected to the p-type substrate 100 as represented by the arrows in the drawing.

A patterned conductor 358 is connected to the polysilicon line 300 by interlayer connectors. Likewise, a patterned conductor 350 is connected by interlayer connectors to the channel well 103. Pattern conductors 358, 350 can be formed in lower ones of the patterned conductor layers on the device, such as in a first metal layer. The conductors 358, 350 are connected to a conductor 360 in the upper patterned conductor layer labeled ML4 this example for a four metal process.

Figure 9:
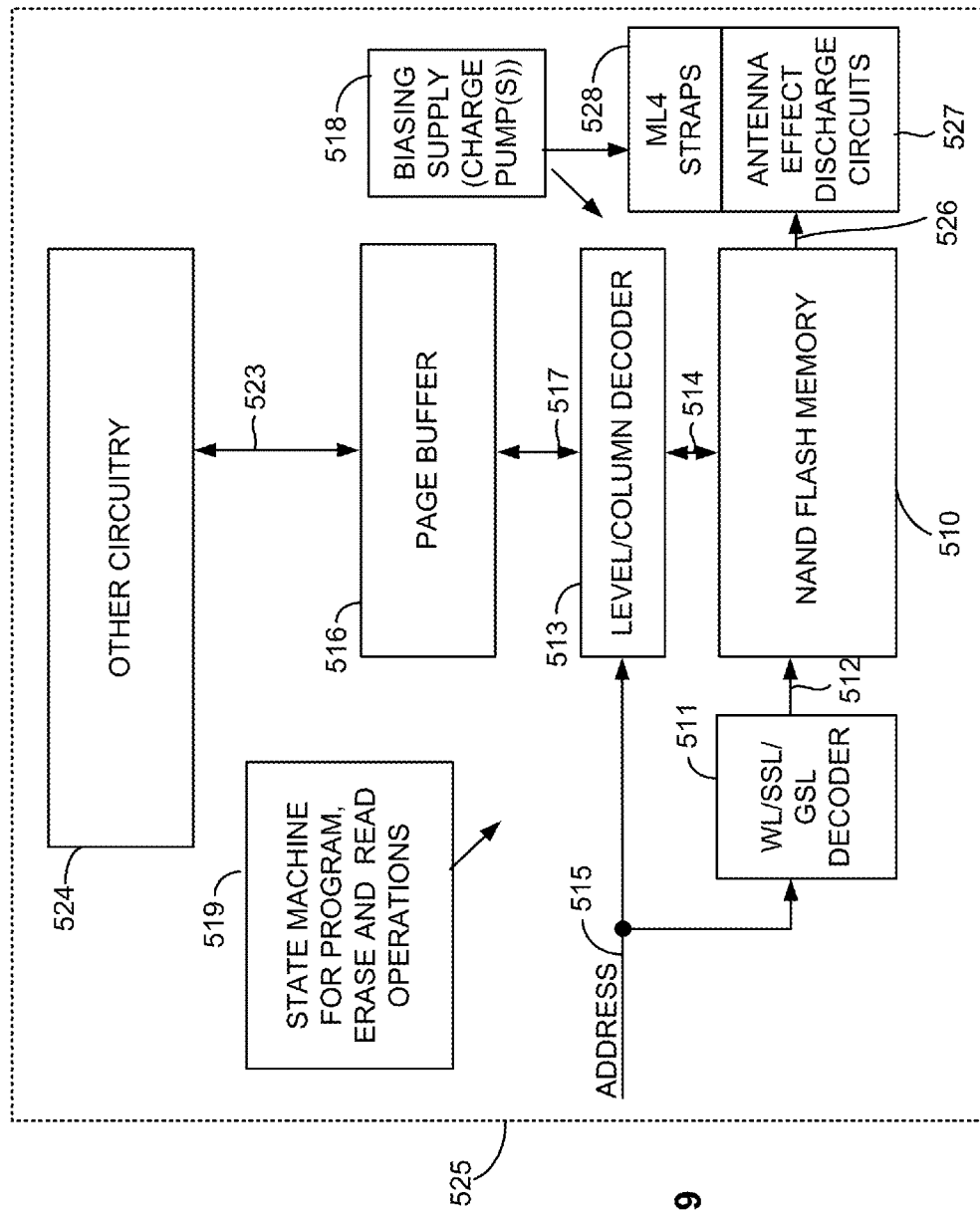
FIG. 9 is a simplified block diagram of an integrated circuit memory array, including antenna effect discharge circuits as described herein.

FIG. 9 is a simplified block diagram of an integrated circuit 525 including a flash memory array 510 including antenna effect discharge circuits 527. In some embodiments, the array 510 is a 3D memory and includes multiple levels of cells. A row decoder 511 is coupled to a plurality of word lines, string select lines and ground select lines (512) in the memory array 510. A level/column decoder in block 513 is coupled to a set of page buffers 516, in this example via data bus 517, and to the global bit lines and source lines 514. Addresses are supplied on bus 515 to level/column decoder (block 513) and row decoder (block 511). Data is supplied via the data-in line 523 from other circuitry 524 (including for example input/output ports) on the integrated circuit, such as a general purpose processor or special purpose application circuitry, or a combination of modules providing system-on-a-chip functionality supported by the array 510. Data is supplied via the data-in line 523 to input/output ports or to other data destinations internal or external to the integrated circuit 525.

A controller, implemented in this example as a state machine 519, provides signals to control the application of bias arrangement supply voltages generated or provided through the voltage supply circuit in block 518 to carry out the various operations including erase, program and read. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The antenna effect discharge circuits 527 having capacitors connected to gates, such as the circuits of FIG. 3 and FIG. 7, are coupled in this example to conductors in the memory array, represented by line 526, which can be word lines, bit lines, string select lines, ground select lines or other conductive lines that can be charged during manufacturing. The antenna effect discharge circuits 527 are connect to the voltage supply circuit 518 by the uppermost patterned conductor layer 528 on the device, labeled herein ML4 for a four metal device. The voltage supply circuit 518 comprises voltage providing circuits, such as positive and negative voltage charge pumps, level shifters, and voltage regulators. In a representative 3D NAND device, positive and negative voltage charge pumps can be included that produce operating voltages which can for example be as high as +30 Volts, and a −10 Volts. Of course, the highest magnitude positive and negative operating voltages, designated VPP and VNP herein, depend on the particular device.

The number of antenna effect discharge circuits provided in a particular integrated circuit will depend on the manufacturing circumstances, the space available, and the needs of the particular product. There may be one antenna effect discharge circuit per word line, in some example products. In other example products, one protection device may be shared among a plurality of word lines. Other nodes in the integrated circuitry on the device can be protected as well.

Figure 10:
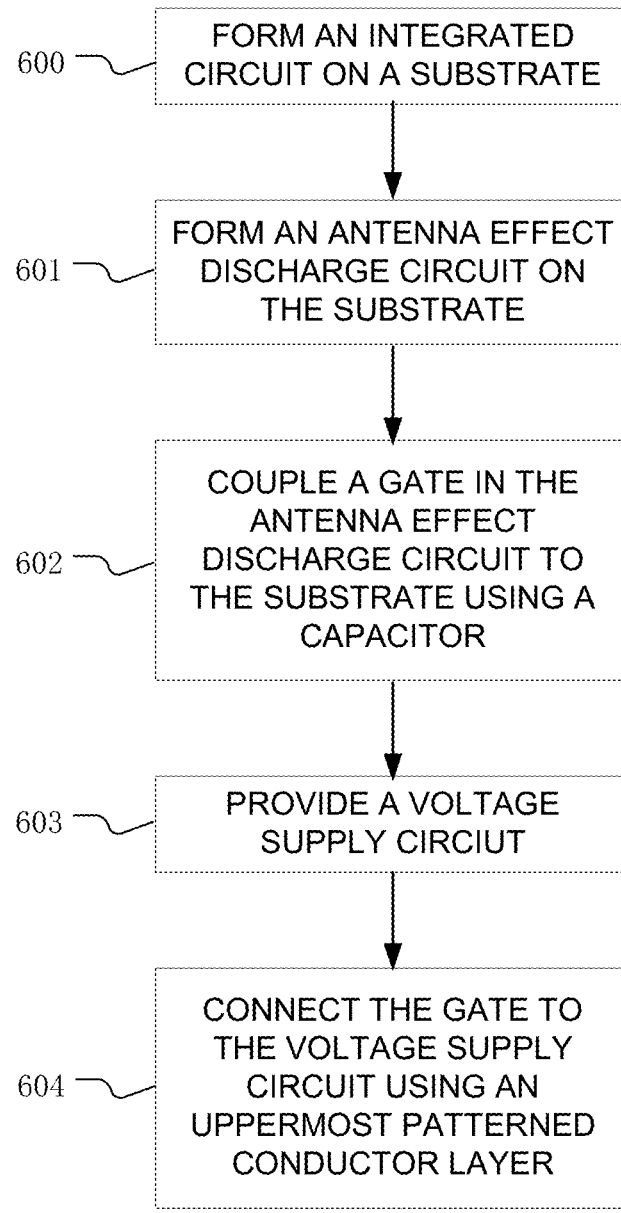
FIG. 10 is a simplified flowchart of a method for manufacturing an integrated circuit utilizing antenna effect discharge circuits as described herein.

FIG. 10 is a simplified flowchart of the manufacturing process including plasma effect discharge circuits as described herein. The process includes forming an integrated circuit on a substrate (600). Also, the process includes forming an antenna effect discharge circuit on the substrate (601) and coupling a gate in the antenna effect discharge circuit to the substrate using a capacitor (602). The process includes providing a voltage supply circuit on the integrated circuit, or coupled to the integrated circuit (603). Finally, the gate is connected to the voltage supply circuit using an upper patterned conductor layer, preferably the uppermost layer, during manufacturing process (604).

Although not illustrated FIG. 10, the process can include providing a switch on the device between the gate and voltage supply circuit, as illustrated above with respect FIG. 7. The switch can be configured to close during operations of the gate is connected to the voltage supply circuit via the switch. The switch can be implemented using high voltage field effect transistors, such as HV-NMOS or HV-PMOS devices, having gates connected to the voltage supply circuits.

The step of wherein forming the antenna effect discharge circuit can include forming n-type and p-type channel wells in the substrate, and first and second capacitor terminal diffusions in the substrate. A p-channel field effect transistor is formed in the n-type channel well, having a gate, a source and a drain in the n-type channel well. An re-channel field effect transistor is formed in the p-type channel well, having a gate, a source and a drain in the p-type channel well. Also, a first capacitor having a first terminal in or connected to the first capacitor terminal diffusion, and a second terminal coupled to the gate of the p-channel field effect transistor is formed. A second capacitor having a first terminal in or connected to the second capacitor terminal diffusion, and a second terminal coupled to the gate of the n-channel field effect transistor. The process includes connecting one of the source and drain of the p-channel field effect transistor to the node to be protected using a patterned conductor, and connecting the other of the source and drain of the p-channel field effect transistor to the device substrate. Also, the process includes connecting one of the source and drain of the n-channel field effect transistor to the node to be protected using a patterned conductor, and the other of the source and drain of the n-channel field effect transistor to the device substrate.

In this example, the step of providing a voltage supply circuit includes providing a voltage supply circuit having a first voltage output providing VPP, that is connected via a first patterned conductor in the upper layer, to the gate of the p-channel field effect transistor to turn off the p-channel field effect transistor during operation; and having a first voltage output providing VNP, that is connected via a second patterned conductor in the upper layer, to the gate n-channel field effect transistor to turn off the re-channel field effect transistor during operation.

The step of providing a switch can include forming a first switch on the device having a first terminal connected to the first patterned conductor in the upper layer and a second terminal connected to the voltage supply circuit, and configuring the first switch to close during operation; and forming a second switch on the device having a first terminal connected to the second patterned conductor in the upper layer and a second terminal connected to the second voltage supply circuit, and configuring the second switch to close during operation.

A new antenna protection circuit and manufacturing method are described. In the illustrated example shown in FIGS. 3, 5 and 6, the gates of the n-channel and p-channel field effect transistors are separately floated after a first metal layer ML1, rather than connected as in prior art circuit shown in FIG. 1.

The gates are connected to large capacitors, coupling them to the p-type substrate. During antenna charging, the gate is closer to p-type substrate potential due to the capacitor. This makes easier turn-on of the field effect transistors. The positive charge will be discharged through the p-channel field effect transistor while negative charge through the n-channel field effect transistor. Experimental data indicates that the p-channel field effect transistor and n-channel field effect transistor used in the new protection circuit can be activated at positive or negative magnitudes of less than 2 V, providing very excellent in-process antenna protection for any new device. Also, it is demonstrated that a larger capacitor area to gate area ratio results in higher discharge current.

A higher gate to substrate coupling ratio (GCR) can make the gate even closer to the substrate potential, providing even lower magnitude turn-on voltage (<2V) for excellent protection.

At the last patterned conductor layer, such as an uppermost metal layer, the antenna protection circuit connected to the VPP and VNP terminals of a voltage supply circuit, and so that they are turned off in operation, and do not affect the device operation.

In order to prevent any possible charging during passivation processes or other higher layer processes, a switch of buffer transistor can be added in between protection circuit's gate and the voltage supply circuit.

The new antenna protection circuit can be applied to normal Flash memory arrays, to other memory devices and to logic circuits, among other types of integrated circuit devices.

The very low protection voltage (<+/−2V) capability can be applied to advanced memory device such as programmable resistance ReRAM or phase change PCRAM, where a very low-voltage (<3V) during in-process charging may cause deterioration in device performance.

In-process charging effect is found to deteriorate the initial Vt distribution of 3D NAND Flash memory integrated circuits. An antenna protection circuit using a capacitive coupled floating gate (CCFG) CMOS circuit, examples of which are described above, can be applied to the wordline (WL) and select transistor (SSL) decoder for the memory integrated circuit. Experimental results of this circuit show a very low turn-on voltage (<+/−2V) for discharging, providing protection for the memory devices. With this technique, a fully-integrated 3D NAND Flash device shows excellent initial threshold voltage Vt distribution across the memory array, apparently free from the charging effect.

Furthermore, the string select line SSL transistor threshold voltage Vt distribution (variations) can have an impact on the minimal Vdd bias. With improved SSL Vt distribution achieved using the antenna protection circuit like that of FIGS. 3, 5 and 6, it is demonstrated that 3D VG NAND Flash can support Vdd as small as 1.6V with successful programming window.

The antenna protection circuit described herein can be applied in the word line WL or string select line SSL/ground select line GSL decoder. Experimental results for a 3D NAND Flash integrated circuit are demonstrated.

A fully integrated split-page 3DVG NAND Flash as described in S. H. Chen, H. T. Lue, et al, "A highly scalable 8-layer vertical gate 3D NAND with split-page bit line layout and efficient binary-sum MiLC (Minimal incremental layer cost) staircase contacts", IEDM pp. 21-24, 2012, including peripheral CMOS devices is studied in this work.

A protection circuit like that of FIGS. 3, 5 and 6, is deployed in the tested device.

Figure 11:
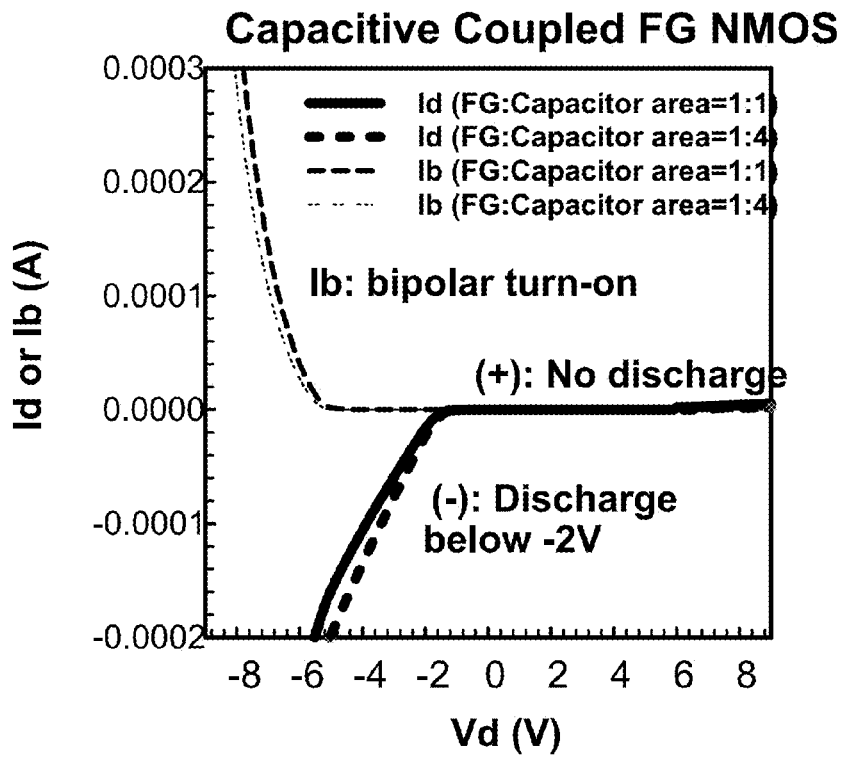
FIG. 11 shows the drain current versus drain voltage (IdVd) curve and the drain voltage versus body current Ib (IbVd) curves of a CCFG NMOS device in the protection circuit.

FIG. 11 shows the drain current versus drain voltage (IdVd) curve and the drain voltage versus body current Ib (IbVd) curves of a CCFG NMOS device in the protection circuit in the condition shown in FIG. 5 above, when gate and PWI are floated, while p-sub, source and DNW are grounded. It does not discharge the positive bias, but it can be easily turned on below −2V to discharge the negative voltage. At −7V, it is observed a significant body current (Ib). This is owing to the parasitic bipolar turn-on through the N+-PWI-DNW parasitic BJT.

Figure 12:
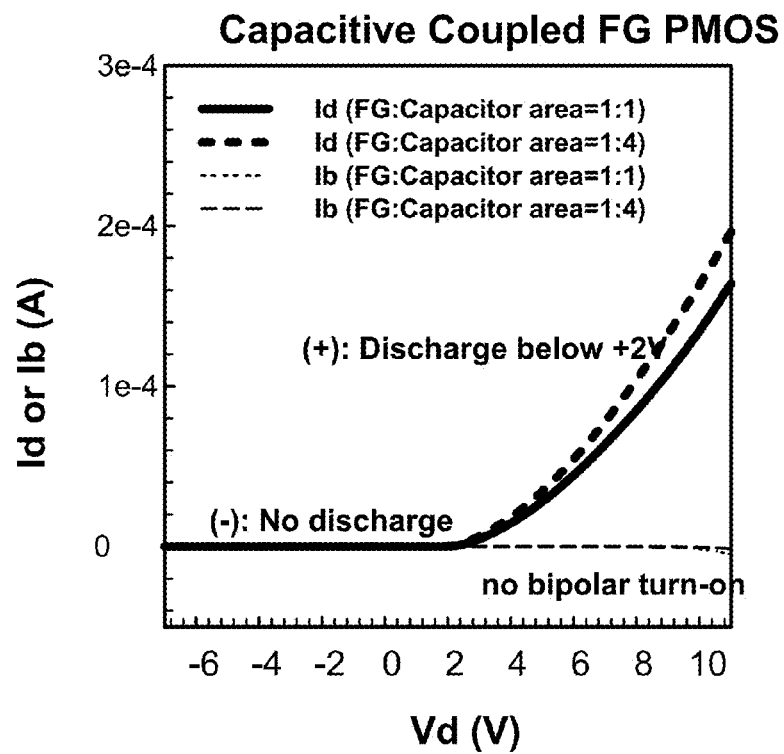
FIG. 12 shows experimental data including the drain current versus drain voltage (IdVd) curve and the drain voltage versus body current Ib (IbVd) curves of a CCFG PMOS device in the protection circuit.

FIG. 12 shows experimental data including the drain current versus drain voltage (IdVd) curve and the drain voltage versus body current Ib (IbVd) curves of a CCFG PMOS device in the protection circuit in the condition shown in FIG. 6 above, when gate and N-well are floated. It shows a low-turn-on voltage at <+2V. There is no observed parasitic bipolar turn-on mode thus body current is not observed. The turn-on voltage at positive bias is less than 2V, allowing excellent protection at low voltage. Body current (Ib) is small, indicating no parasitic BJT mode.

Figure 13:
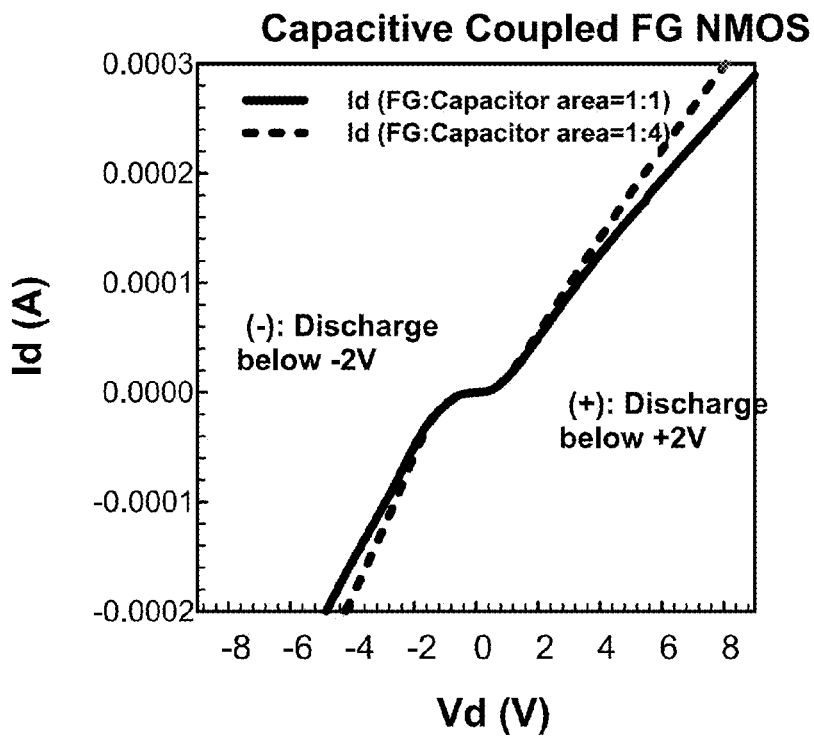
FIG. 13 shows experimental data including discharging current of a complete CCFG CMOS protection circuit (when gate and wells are floated) like that of FIGS. 5 and 6.

FIG. 13 shows experimental data including discharging current of a complete CCFG CMOS protection circuit (when gate and wells are floated) like that of FIGS. 5 and 6. It shows very low turn-on voltage below +/−2V, providing an ideal protection for the devices. A higher ratio of capacitance over FG area gives higher turn-on current. Note that both NMOS and PMOS can be high-voltage (HV) devices to sustain the very high operation voltages of WL's, SSL's, or GSL's.

Figure 14:
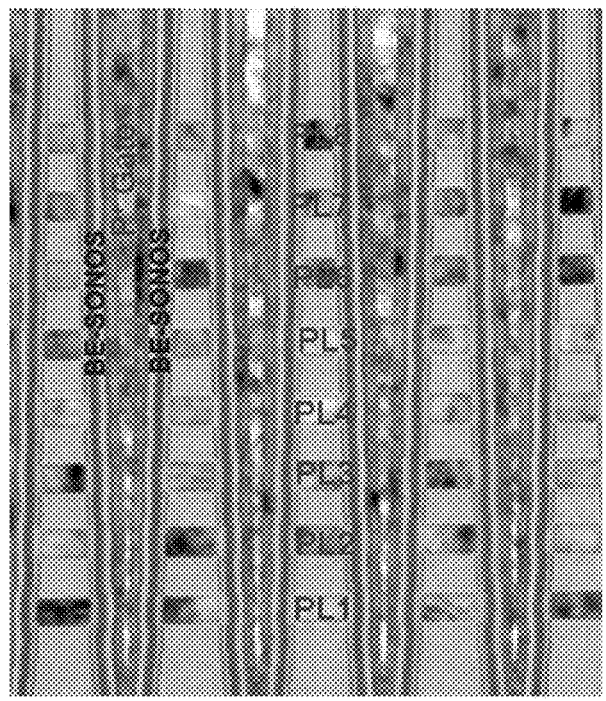
FIG. 14 is an image produced by a TEM cross-sectional view of the measured 8-layer 3DVG device.
Figure 15:
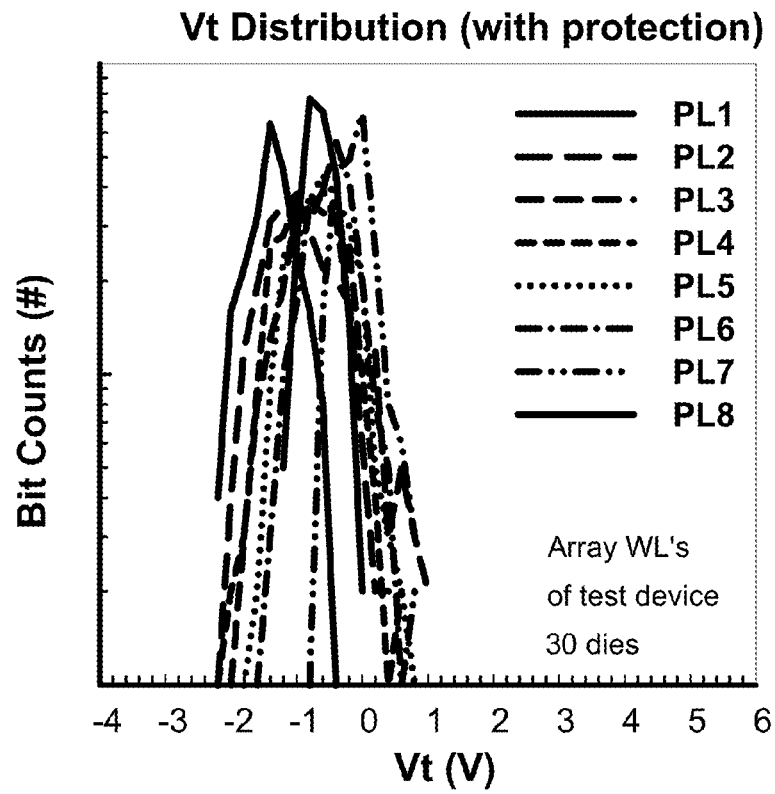
FIG. 15 is a graph showing the initial threshold voltage distributions of the memory cells on the multiple layers of the tested device.

FIG. 14 is an image produced by a TEM cross-sectional view of the measured 8-layer 3DVG device. FIG. 15 is a graph showing the initial threshold voltage distributions of the memory cells on the multiple layers of the tested device. With the protection circuit, the initial state as shown in FIG. 15 has an excellent and nearly normal Vt distribution. Certain deviations between the eight layers designated PL1 to PL8 are observed, which is expected since there are process and dimension deviations between memory layers.

Figure 16:
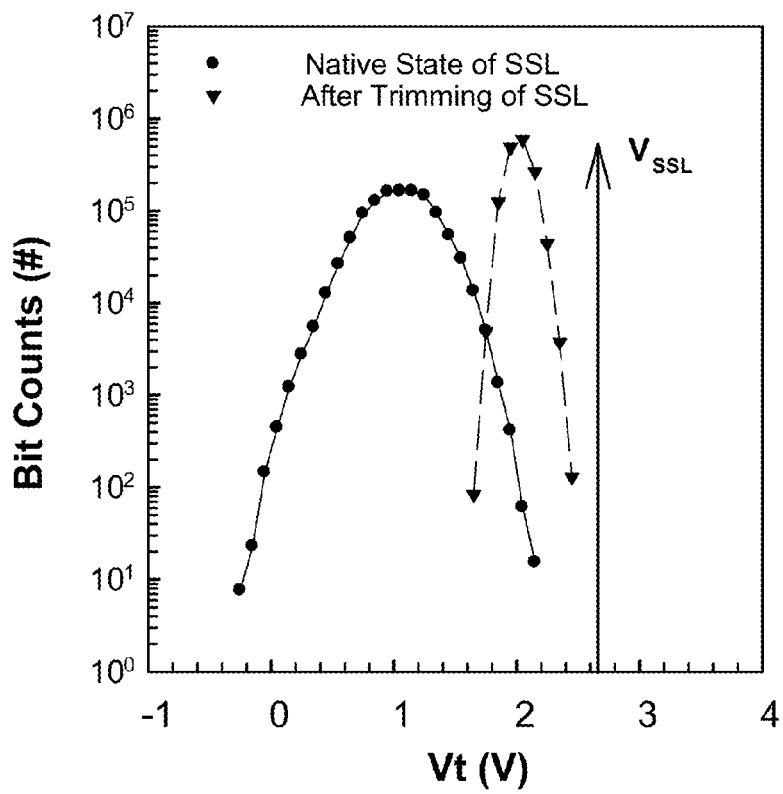
FIG. 16 shows the SSL Vt distribution for the tested circuit.

FIG. 16 shows the SSL Vt distribution. The intrinsic sigma of SSL can be smaller than 250 mV. With certain trimming which is carried out by a soft programming and verify, the sigma can be further reduced to nearly 100 mV.

Figure 17:
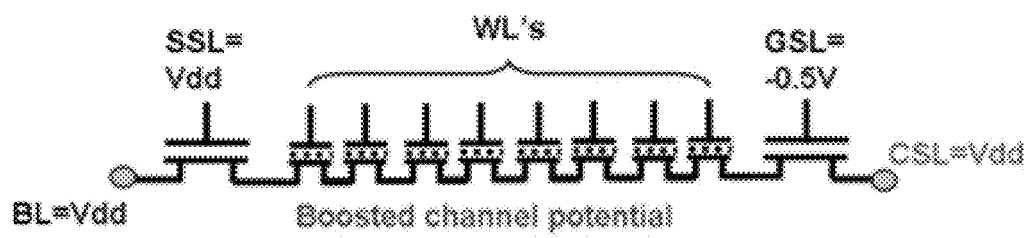
FIG. 17 is a schematic diagram of a simplified NAND string for reference.
Figure 18:
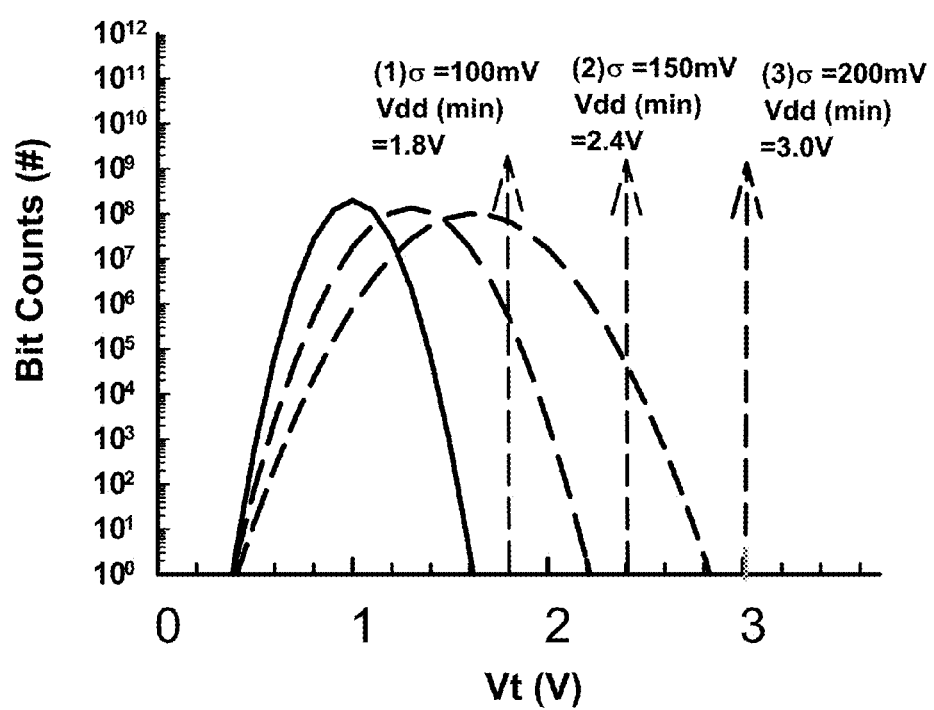
FIG. 18 is a graph showing three SSL threshold voltage distributions (Vt ranges) with increasing sigma σ.

The impact of SSL distribution is shown in FIGS. 17 and 18. FIG. 17 is a schematic diagram of a simplified NAND string for reference. During self-boosting programming, both BL bias and SSL gate bias are applied Vdd. FIG. 18 is a graph showing three SSL threshold voltage distributions (Vt ranges) with increasing sigma σ. The lower-boundary of the Vt range should be above 0.4V to guarantee sufficient punch-through immunity to sustain self-boosting. On the other hand, the higher-boundary of the Vt range limits the minimum Vdd applied in SSL's and BL's. A tighter SSL distribution (lower sigma σ) can enable lower Vdd.

Figure 19:
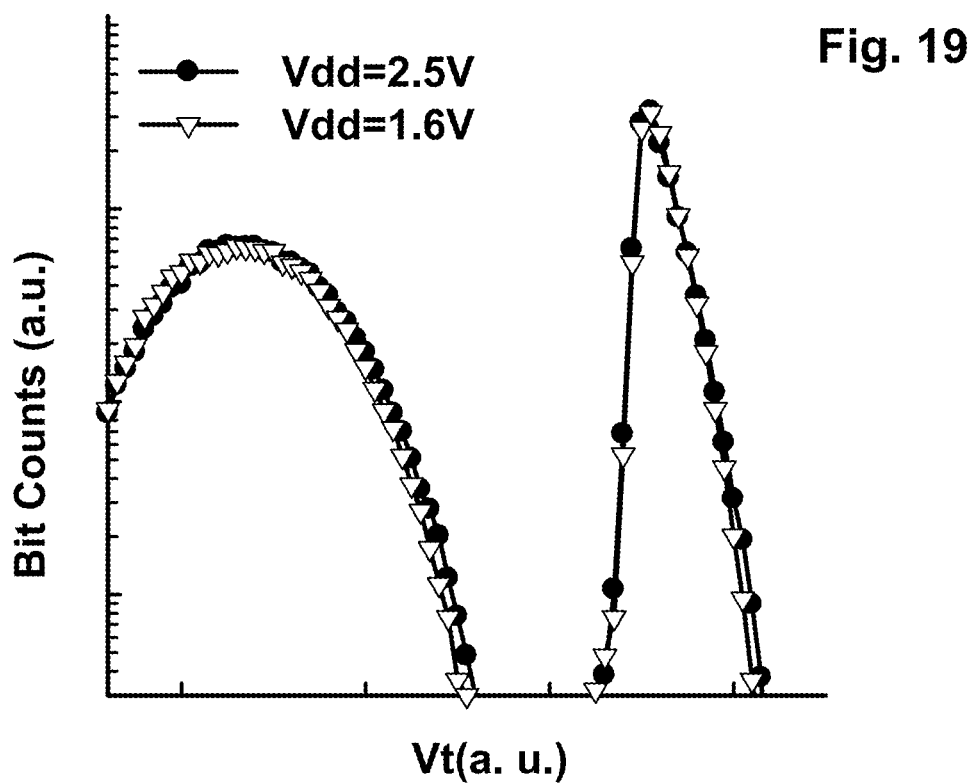
FIG. 19 is a graph of low and high threshold states in the tested device for programming checkerboard window test.

A tighter Vt distribution of SSL can be important to reduce the minimal required Vdd. FIG. 19 is a graph of low and high threshold states in the tested device for programming checkerboard window test, showing that with improved SSL Vt distribution, the tested 3D VG NAND Flash can operate under a minimal Vdd=1.6V. Lower Vdd helps to reduce the power consumption.

Figure 20:
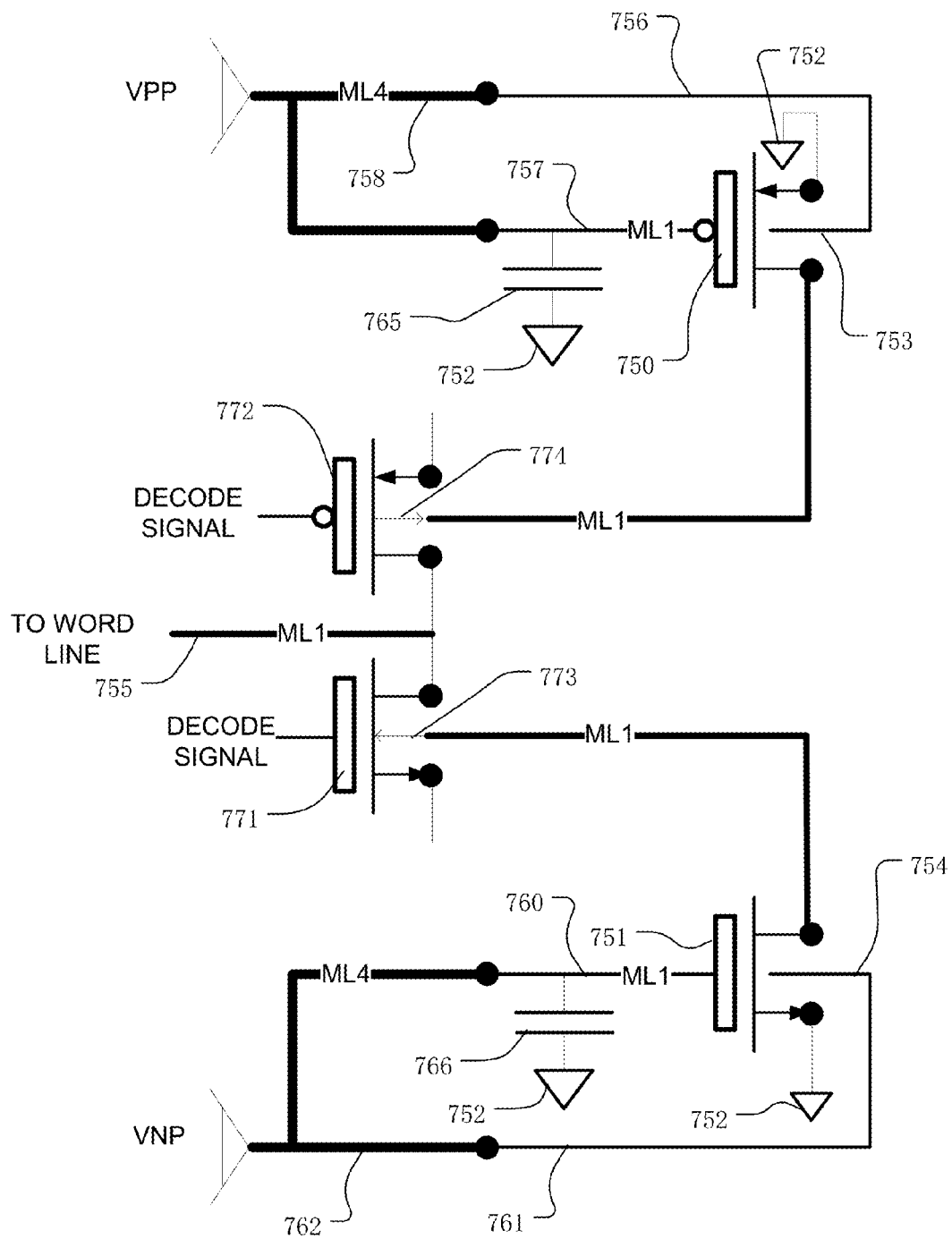
FIG. 20 is a circuit diagram of an example of the antenna protection circuit applied for a CMOS decoder design.

In FIG. 20, an example of implementation of the antenna protection circuit applied for a CMOS decoder design is shown. The antenna effect discharge circuit protects a circuit that is part of a CMOS decoder that includes a p-channel field effect transistor 772 and an n-channel field effect transistor 771 have drains coupled to a node 755 to be connected to a word line driven by the decoder. The gates of the transistors 771, 772 are connected to decode signals according to the design of the decoder. The n-channel field effect transistor 771 is formed in a p-type well 773. The p-channel field effect transistor 772 is formed in an n-type well 774.

In the circuit, a PMOS protection circuit including a p-channel field effect transistor 750 is connected to the p-channel transistor 772, and an NMOS protection circuit including an n-channel field effect transistor 751 is connected to the n-channel transistor 771. The p-channel field effect transistor 750 and the n-channel field effect transistor 751 have drains coupled respectively to the n-type well 774 and the p-type well 773 of the p-channel field effect transistor 772 and the n-channel field effect transistor 771 in the decoder circuit to be protected from antenna effect charging. The sources of the field effect transistors 750, 751 are connected to the substrate 752. The gate of the field effect transistor 750 is connected by a patterned conductor 757 (e.g. a polysilicon line or a first layer metal line ML1) to a capacitor 765 having a first terminal connected to the conductor 757 and a second terminal in or connected to the substrate 752. The gate of the field effect transistor 751 is connected by a patterned conductor 760 (e.g. a polysilicon line or a first layer metal line) to a capacitor 766 having a first terminal connected to the conductor 760 and a second terminal in or connected to the substrate 752.

The p-channel field effect transistor 750 has a channel in an n-type semiconductor region, referred to herein as a channel well 753, in the substrate. The channel well 753 is connected to a conductor 756. The conductor 756 and conductor 757 are not connected during manufacturing of the device, until an upper patterned conductor layer, preferably the uppermost patterned conductor layer, is formed. The upper patterned conductor layer includes a conductor 758 which provides connection between the channel well 753 and the gate of the field effect transistor 750 via the conductors 757 and 756. Also, the conductor 758 connects to the voltage supply circuit, which provides the bias voltage VPP.

The n-channel field effect transistor 751 has a channel in a p-type semiconductor region, referred to herein as a channel well 754, in the substrate. The channel well 754 is connected to a conductor 761. The conductor 761 and conductor 760 are not connected during manufacturing of the device, until an upper patterned conductor layer, preferably the uppermost patterned conductor layer, is formed. The upper patterned conductor layer includes a conductor 762 which provides connection between the channel well 754 and the gate of the field effect transistor 751 via the conductors 760, 761. Also the conductor 762 connects to the voltage supply circuit, which provides the bias voltage VNP.

A single CCFG NMOS protection circuit as shown in FIG. 20, can be applied to protect a shared p-type well 773 PWI of plural NMOS drivers (only one is shown), while a single CCFG PMOS is applied at a shared n-type well 774 of plural PMOS drivers (only one is shown). This greatly saves the required area.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device, comprising:
   a substrate;
   a plurality of layers of patterned conductors and interlayer connectors on the substrate, the plurality of layers including an upper layer and one or more lower layers;
   an antenna effect discharge circuit on the substrate including a transistor having a gate, a channel well, and source and drain terminals in the channel well;
   a capacitor having a first terminal in, or connected to, the substrate, and a second terminal connected to the gate;
   a voltage supply circuit configured to provide a voltage sufficient to bias the antenna effect discharge circuit in an off condition during operation of the integrated circuit device; and
   a patterned conductor in the upper layer linking the gate to the voltage supply circuit and to the channel well of the transistor; and
   a switch configured to close during operation of the integrated circuit device, and having first and second terminals, the first terminal being connected to the gate by a first connector, and the second terminal being connected to the voltage supply circuit by a second connector, and wherein one or both of the first and second connectors includes the patterned conductor in the upper layer.

2. The integrated circuit device of claim 1, wherein the upper layer is an uppermost patterned conductor layer in the integrated circuit device.

3. The integrated circuit device of claim 1, including a passivation layer over the upper layer.

4. The integrated circuit device of claim 1, further comprising a memory array having a word line, wherein the antenna effect discharge circuit is connected to the word line.

5. The integrated circuit device of claim 1, wherein the voltage supply circuit includes a charge pump circuitry on the device substrate.

6. An integrated circuit device, comprising:
   a substrate;
   a plurality of layers of patterned conductors and interlayer connectors on the substrate, the plurality of layers including an upper layer and one or more lower layers;
   an antenna effect discharge circuit on the substrate including a transistor having a gate, a channel well, and source and drain terminals in the channel well;
   a capacitor having a first terminal in, or connected to, the substrate, and a second terminal connected to the gate;
   a voltage supply circuit configured to provide a voltage sufficient to bias the antenna effect discharge circuit in an off condition during operation of the integrated circuit device;
   a patterned conductor in the upper layer linking the gate to the voltage supply circuit and to the channel well of the transistor, wherein the transistor is a field effect transistor on the integrated circuit device substrate, having the gate in one of the layers and the channel well connected via one or more of the layers to a conductor in one of the layers, and one of the source and drain terminals of the field effect transistor is connected via one or more of the lower layers to a node which has operating voltages applied during operation of the integrated circuit device, and the other of the source and drain terminals of the field effect transistor is connected via one or more of the lower layers to the device substrate.

7. The integrated circuit device of claim 6, wherein the device substrate comprises a p-type semiconductor including an n-type well; and the field effect transistor includes:
a PMOS transistor, and the n-type well is the channel well.

8. The integrated circuit device of claim 6, wherein the device substrate comprises a p-type semiconductor including a p-type well within an n-type well; and
the field effect transistor includes:
an NMOS transistor, and the p-type well is the channel well.

9. The integrated circuit device of claim 6, wherein the channel well is a doped well in the device substrate.

10. An integrated circuit device, comprising:
a device substrate;
integrated circuitry on the device substrate having a plurality of patterned conductor layers, the plurality of patterned conductor layers including an upper layer and one or more lower layers, the one or more lower layers including a node, the node having operating voltages applied thereto during operation;
a p-channel field effect transistor and an n-channel field effect transistor on the device substrate, having respective gates, respective channel wells, and respective sources and drains in the respective channel wells;
a first capacitor having a first terminal in, or connected to, a region in the device substrate, and a second terminal connected to the gate of the p-channel field effect transistor;
a second capacitor having a first terminal in, or connected to, a region in the device substrate, and a second terminal connected to the gate of the n-channel field effect transistor;
one of the source and drain of the each of the p-channel field effect transistor and n-channel field effect transistor being connected to the node, the other of the source and drain of each of the p-channel field effect transistor and n-channel field effect transistor being connected to the device substrate;
a voltage supply circuit configured to provide a first voltage sufficient to bias the p-channel field effect transistor in an off condition during operation at the operating voltages, and to provide a second voltage sufficient to bias the n-channel field effect transistor in an off condition during operation at the operating voltages;
a first patterned conductor in the upper layer connecting the gate and the channel well of the p-channel field effect transistor to the voltage supply circuit; and
a second patterned conductor in the upper layer connecting the gate and the channel well of the n-channel field effect transistor to the voltage supply circuit.

11. The device of claim 10, wherein the upper layer is an uppermost patterned conductor layer in the device.

12. The device of claim 11, including a passivation layer over the uppermost layer.

13. The device of claim 11, including:
a first switch on the device configured to close during operation of the device, and having first and second terminals, the first terminal being connected to the gate of the p-channel field effect transistor by a first connector, and the second terminal being connected to the voltage supply circuit by a second connector, and wherein one or both of the first and second connectors includes the first patterned conductor in the upper layer; and
a second switch on the device configured to close during operation of the device, and having first and second terminals, the first terminal being connected to the gate of the n-channel field effect transistor by a first connector, and the second terminal being connected to the voltage supply circuit by a second connector, and wherein one or both of the first and second connectors includes the second patterned conductor in the upper layer.

14. The device of claim 10, wherein the device substrate comprises a p-type semiconductor material;
the channel well of the p-channel field effect transistor is an n-type well in the device substrate; and
the channel well of the n-channel field effect transistor is an p-type well, within an n-type well in the device substrate.

15. The device of claim 10, wherein the integrated circuitry comprises a memory array having a word line, and the node includes the word line.

16. A method for manufacturing an integrated circuit device, comprising:
forming integrated circuitry on a substrate, the circuitry having a node to be protected from plasma discharge;
forming an antenna effect discharge circuit on the substrate, having a terminal connected to the node, and a transistor including a gate, a channel well, and source and drain terminals in the channel well, the gate coupled via a capacitor to the substrate;
using a manufacturing process that exposes the node to be protected to a charge inducing environment and discharging induced charge using the antenna effect discharge circuit;
providing a voltage supply circuit on the substrate to bias the gate during operation of the integrated circuitry to turn off the antenna effect discharge circuit;
connecting the gate to the channel well and to the voltage supply circuit using an upper patterned conductor layer on the device;
providing a switch on the device having first and second terminals, the first terminal being connected to the gate by a first connector, and the second terminal being connected to the voltage supply circuit by a second connector, and wherein one or both of the first and second connectors includes a conductor in the upper patterned conductor layer; and
configuring the switch to be closed during operation so that the gate is connected to the voltage supply circuit via the switch.

17. A method for manufacturing an integrated circuit device, comprising:
forming integrated circuitry on a substrate, the circuitry having a node to be protected from plasma discharge;
forming an antenna effect discharge circuit on the substrate, having a terminal connected to the node, and a transistor including a gate, a channel well, and source and drain terminals in the channel well, the gate coupled via a capacitor to the substrate;
using a manufacturing process that exposes the node to be protected to a charge inducing environment and discharging induced charge using the antenna effect discharge circuit;

providing a voltage supply circuit on the substrate to bias the gate during operation of the integrated circuitry to turn off the antenna effect discharge circuit;

connecting the gate to the channel well and to the voltage supply circuit using an upper patterned conductor layer on the device, wherein forming the antenna effect discharge circuit includes:

forming a p-channel field effect transistor on the device substrate, having a gate, an n-type channel well, and a source and a drain in the n-type channel well;

forming an n-channel field effect transistor on the device substrate, having a gate, a p-type channel well, and a source and a drain in the p-type channel well;

forming a first capacitor having a first terminal in or connected to the device substrate, and a second terminal coupled to the gate of the p-channel field effect transistor;

forming a second capacitor having a first terminal in or connected to the device substrate, and a second terminal coupled to the gate of the n-channel field effect transistor;

connecting one of the source and drain of the p-channel field effect transistor to the node using a patterned conductor, and the other of the source and drain of the p-channel field effect transistor to the device substrate; and connecting one of the source and drain of the n-channel field effect transistor to the node using a patterned conductor, and the other of the source and drain of the n-channel field effect transistor to the device substrate.

18. The method of claim 17, wherein providing the voltage supply circuit includes:

providing a voltage supply circuit connected via a first patterned conductor in the upper layer, to the gate of the p-channel field effect transistor to turn off the p-channel field effect transistor during operation; and connected via a second patterned conductor in the upper layer, to the gate of the n-channel field effect transistor to turn off the n-channel field effect transistor during operation.

19. The method of claim 18, including:

forming a first switch on the device having a first terminal connected to the first patterned conductor in the upper layer and a second terminal connected to the voltage supply circuit, and configuring the first switch to close during operation; and forming a second switch on the device having a first terminal connected to the second patterned conductor in the upper layer and a second terminal connected to a second voltage supply circuit, and configuring the second switch to close during operation.

* * * * *